United States Patent
Lee et al.

(10) Patent No.: US 8,227,894 B2
(45) Date of Patent: Jul. 24, 2012

(54) STEPWISE CAPACITOR STRUCTURE AND SUBSTRATE EMPLOYING THE SAME

(75) Inventors: Min-Lin Lee, Hsinchu (TW);
Shih-Hsien Wu, Taoyuan County (TW);
Shinn-Juh Lai, Hsinchu County (TW);
Shur-Fen Liu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 495 days.

(21) Appl. No.: 12/410,466

(22) Filed: Mar. 25, 2009

(65) Prior Publication Data

US 2009/0180236 A1   Jul. 16, 2009

Related U.S. Application Data

(63) Continuation-in-part of application No. 12/173,032, filed on Jul. 15, 2008, now abandoned.

(30) Foreign Application Priority Data

Nov. 21, 2007 (TW) ................................ 96144117 A
Nov. 20, 2008 (TW) ................................ 97144950 A

(51) Int. Cl.
*H01L 29/423* (2006.01)

(52) U.S. Cl. ......... 257/532; 257/E29.123; 257/E29.343; 361/306.2

(58) Field of Classification Search .................. 257/534; 361/306.2
See application file for complete search history.

(56) References Cited

U.S. PATENT DOCUMENTS

| 5,339,212 | A | * | 8/1994 | Geffken et al. ............ 361/306.2 |
| 6,532,143 | B2 |   | 3/2003 | Figueroa et al. |
| 6,992,368 | B2 | * | 1/2006 | Volant et al. ................. 257/532 |
| 2005/0146840 | A1 |   | 7/2005 | Lee et al. |
| 2006/0081960 | A1 | * | 4/2006 | Wu ............................. 257/532 |
| 2009/0213526 | A1 | * | 8/2009 | Hsu et al. .................. 361/306.1 |
| 2009/0219668 | A1 | * | 9/2009 | Hsu et al. ...................... 361/303 |

FOREIGN PATENT DOCUMENTS

| CN | 1484840 | 3/2004 |
| CN | 1504066 | 6/2004 |
| JP | 60-049621 U | 4/1985 |
| JP | 09-035986 | 2/1997 |
| JP | 10-064755 | 3/1998 |
| JP | 2004-179349 | 6/2004 |

OTHER PUBLICATIONS

"Office Action of Japan Counterpart Application", issued on Apr. 5, 2011, p. 1-p. 2, in which the listed references were cited.
"1st Office Action of Chinese Counterpart Application", issued on Sep. 27, 2010, p. 1-p. 14, in which the listed references were cited.

* cited by examiner

*Primary Examiner* — Stephen W Smoot
(74) *Attorney, Agent, or Firm* — Jianq Chyun IP Office

(57) ABSTRACT

A stepwise capacitor structure includes at least one stepwise conductive layer. The stepwise capacitor represents a feature of multiple capacitors. When currents flow through the stepwise capacitor, different current paths are presented in between an upper conductor and a bottom conductor of the stepwise capacitor in response to different current frequency; different inductor is induced in each path and decoupled by a stepwise capacitor structure as disclosed herein.

41 Claims, 29 Drawing Sheets

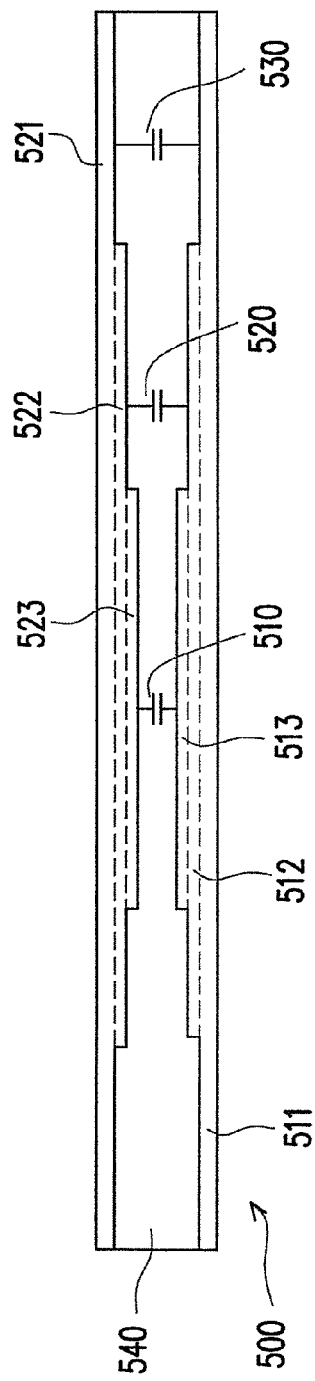
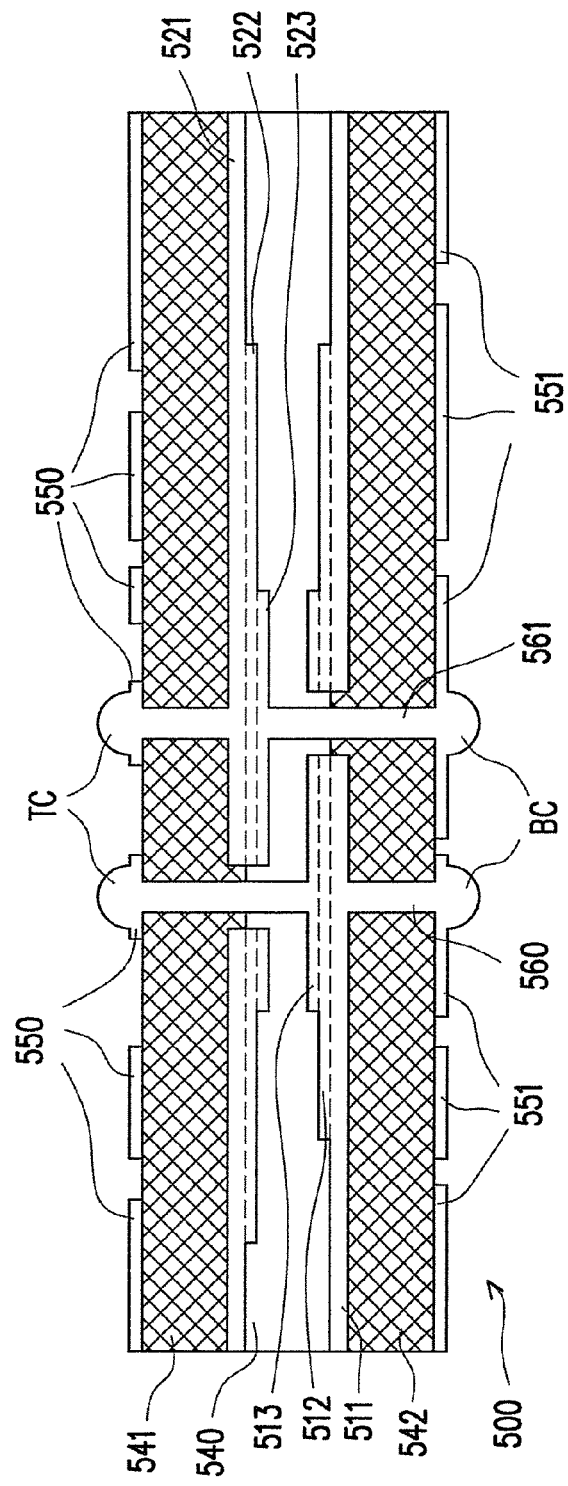
FIG. 5A
FIG. 5B

US 8,227,894 B2

STEPWISE CAPACITOR STRUCTURE AND SUBSTRATE EMPLOYING THE SAME

CROSS-REFERENCE TO RELATED APPLICATION

This is a continuation-in-part application of and claims the priority benefit of patent application Ser. No. 12/173,032, filed Jul. 15, 2008, now abandoned. The prior application Ser. No. 12/173,032 claims the priority benefit of Taiwan patent application Ser. No. 96144117, filed on Nov. 21, 2007. This application also claims the priority benefit of Taiwan application serial no. 97144950, filed Nov. 20, 2008. The entirety of each of the above-mentioned patent applications is hereby incorporated by reference herein and made a part of this specification.

BACKGROUND OF THE INVENTION

1. Field of the Invention

The present invention relates to a capacitor structure, especially a stepwise capacitor structure which represents a feature of multiple capacitors; and a fabrication method thereof, and a substrate employing the same.

2. Description of Related Art

An electronic circuit today, such as a computer, has powerful functions and an increasing processing speed. Along with an increasing operation frequency of the electronic circuit, the noises at the power terminal and the ground terminal thereof get more and more serious and anxious. In order to reduce the noises, a so-called decoupling capacitor is introduced and disposed between the power and the circuit.

In addition, the transient current required by a chip during the operation sometimes would be higher than the available current provided by the on-chip capacitors of the chip, which degrades the processing performance of the chip. To solve the problem, an off-chip capacitor is disposed at an appropriate position outside the chip or on the chip surface, wherein some circuit areas of the chip which may draw large transient currents are termed as 'hot-spots' hereinafter.

In general, the position for disposing a decoupling capacitor is preferably near to a die load or a hot spot as close as possible to enhance the performance. In particular, a decoupling capacitor is usually disposed on the die-side or the land-side of a chip. FIG. 1 is a cross-section diagram of an integrated circuit (IC) 104 with die side capacitors 106 and land side capacitors 108 in the prior art. As shown by FIG. 1, an IC 104 is disposed on a substrate 102. Die side capacitors 106 are disposed on the same surface with the IC 104, and land side capacitors 108 are disposed on opposite surface to the IC 104.

FIG. 2 is the equivalent circuit diagram of FIG. 1. The die load 202 herein represents some portions of the integrated circuit (IC) 104 which need currents provided by capacitors. The currents may be provided by an on-chip capacitor 204 of the chip 104, or by an off-chip capacitor 206 (for example, the die side capacitors 106 and the land side capacitors 108 in FIG. 1). However, due to chip packaging, the capacitor 206 must be spaced from the die load 202 by a distance, which results in an inductance effect represented by an inductor 208. If the inductance (or impedance) of the inductor 208 is getting higher, the response speed of the capacitor 206 gets slower and the ability of noise-processing of the capacitor 206 is accordingly reduced. This means the ability of noise-processing of the capacitor 206 is reduced when the inductance (or impedance) of the inductor 208 is high. As a result, the circuit efficiency is significantly affected.

To overcome the above-mentioned problem, a hierarchical capacitor structure has been developed in another prior art. FIG. 3 is a cross-section diagram of a conventional hierarchical capacitor structure and FIG. 4 is the equivalent circuit diagram of FIG. 3.

Referring to FIGS. 3 and 4, a conventional hierarchical capacitor structure 300 includes three capacitor structures 302, 304 and 306. The capacitor structure 302 is defined by layers 311-315 (including both dielectric layers and conductive layers); the capacitor structure 304 is defined by layers 316-320 (including both dielectric layers and conductive layers); the capacitor structure 306 is defined by layers 321-325 (including both dielectric layers and conductive layers). The capacitor structures 302, 304 and 306 are electrically connected to the layers 311-325 through conductive vias 330, 332 and 334, and the coupling is shown by FIG. 3.

The capacitor structures 302, 304 and 306 are electrically connected to outside circuitry by the conductive vias 330, 332, 334 and a top connector 340 and a bottom connector 342.

The quantity of the conductive vias 330, 332 and 334 passing through capacitor structures may affect the effective capacitance and the effective inductance of the capacitor structures. In detail, more the conductive vias 330, 332 and 334, less the effective capacitance and the effective inductance of the capacitor structures are; longer the conductive vias 330, 332 and 334, greater the effective inductance of the capacitor structures is. Besides, by connecting in parallel the conductive vias 330, 332 and 334, the effective inductance of the capacitor structures would be reduced.

The equivalent circuit of the capacitor structure 302 includes a capacitor 408 and an inductor 420 is shown by FIG. 4; the equivalent circuit of the capacitor structure 304 includes a capacitor 410 and an inductor 422 is shown by FIG. 4; the equivalent circuit of the capacitor structure 306 includes a capacitor 412 and an inductor 424 is shown by FIG. 4, wherein the capacitance of the three capacitors are subject to: 412>410>408 and the inductance of the three inductors are subject to 424>422>420. Since the current rate of the capacitor is affected by the current path (i.e. the inductor), therefore, the current rates of the three capacitors are subject to 408>410>412. FIG. 4 is the diagram of the equivalent circuit for the conventional hierarchical capacitor structure in FIG. 3, wherein capacitor 404 represents an on-chip capacitor.

A combination of the capacitor 408 and the inductor 420 enables the capacitor 408 competent for suppressing high-frequency noise. Since the capacitor 408 has small capacitance, the available transient current (high frequency) provided by the capacitor 408 is not large.

The current rate of the capacitor 410 is slower than that of the capacitor 408, therefore, the capacitor 410 is suitable for suppressing medium-frequency noise; the current rate of the capacitor 412 is the slowest, therefore, the capacitor 412 is suitable for suppressing low-frequency noise only.

Note that when a die load draws current, it usually draws different currents from different conductive vias. For example, the die load draws large currents from nearer conductive vias and draws small currents from farther conductive vias. Accordingly, it suggests that assuming a number of conductive vias are disposed around a small capacitor structure (for example, 302 in FIG. 3), some of current-drawing points still may not contribute to reduce the expected effect of reducing inductance (since the conductive vias are not effectively connected in parallel). Therefore, the inductor-capacitor combination scheme of FIG. 3 (a large capacitor paired with a large inductor, and a small capacitor paired with a small inductor) may not function as expected. In addition, although the capacitor structure 304 is initially designed to be paired with the equivalent medium inductor 422, but the current path between the current-drawing point and the capacitor structure 304 is still too long, which makes the effective inductance of the capacitor structure 304 greater than the medium inductor 422, and the architecture of FIG. 3 fails to achieve the desired efficiency.

In other words, for the architecture of FIG. 3, only effectively parallel-connected conductive vias can effectively reduce the inductance; however, the architecture does not assure the conductive vias in effective parallel connection, which is a real obstacle to make the architecture function as a hierarchical decoupling capacitor structure.

SUMMARY OF THE INVENTION

The disclosed embodiments is directed to a stepwise capacitor structure and a substrate employing the capacitor structure, wherein the current-drawing points of a die load may be paired with current paths having minimum impedance (i.e. minimum inductance) to achieve an effective parallel connection.

Additional descriptions of the disclosed embodiments is also directed to a method of fabricating a multi-layer stepwise capacitor structure capable of improving production yield and changing capacitance based on a need.

Additional descriptions of the disclosed embodiments is also directed to a method of fabricating a single-layer stepwise capacitor structure capable of improving production yield and changing capacitance based on a need.

Additional descriptions of the disclosed embodiments provide a stepwise capacitor structure and a substrate having the capacitor structure. In one embodiment, the stepwise capacitor structure includes an upper conductive layer, a lower conductive layer, and a dielectric layer disposed between the upper conductive layer and the lower conductive layer. The upper conductive layer, the middle dielectric layer, and the lower conductive layer form the stepwise capacitor structure. At least one of the conductive layers has a stepwise structure.

Additional descriptions of the disclosed embodiments provide a fabrication method of a stepwise capacitor structure including a lower conductive layer. The lower conductive layer has a first conductive layer and a second conductive layer, and the lower conductive layer has a stepwise structure. The method further provides an upper conductive layer and a first dielectric layer and combines with the stepwise lower conductive layer, the first dielectric layer, and the upper conductive layer to form the stepwise capacitor structure.

It is to be understood that both the foregoing general description and the following detailed description are exemplary, and are intended to provide further explanation of the disclosed embodiments, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5A and FIG. 5B are cross-section diagrams of a multi-tier stepwise capacitor structure according to an embodiment of the present invention.

DESCRIPTION OF THE EMBODIMENTS

Figure 1:
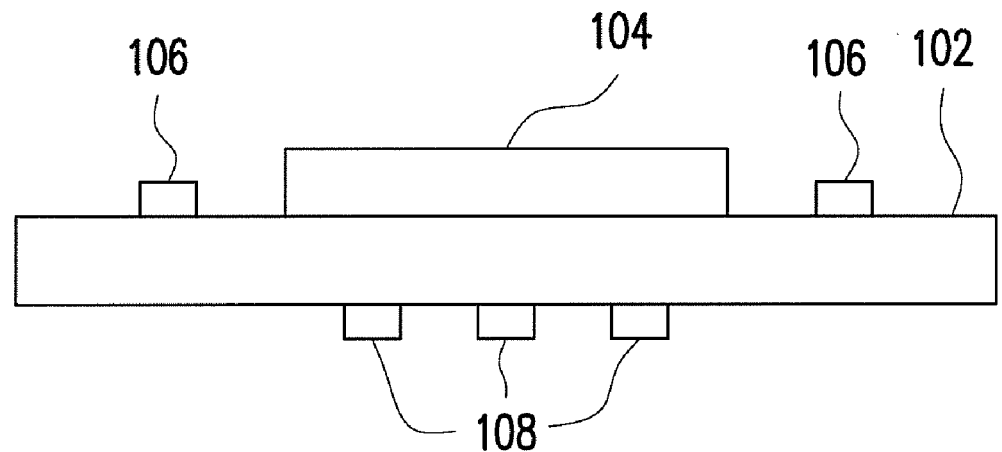
FIG. 1 is a cross-section diagram of an IC 104 with a die side capacitor 106 and a land side capacitor 108 in the prior art.
Figure 2:
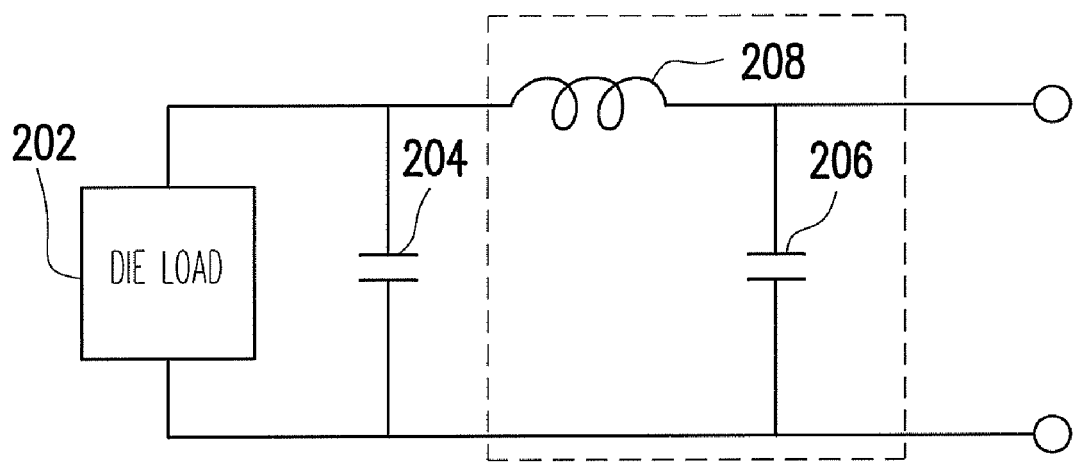
FIG. 2 is the equivalent circuit diagram of FIG. 1.
Figure 3:
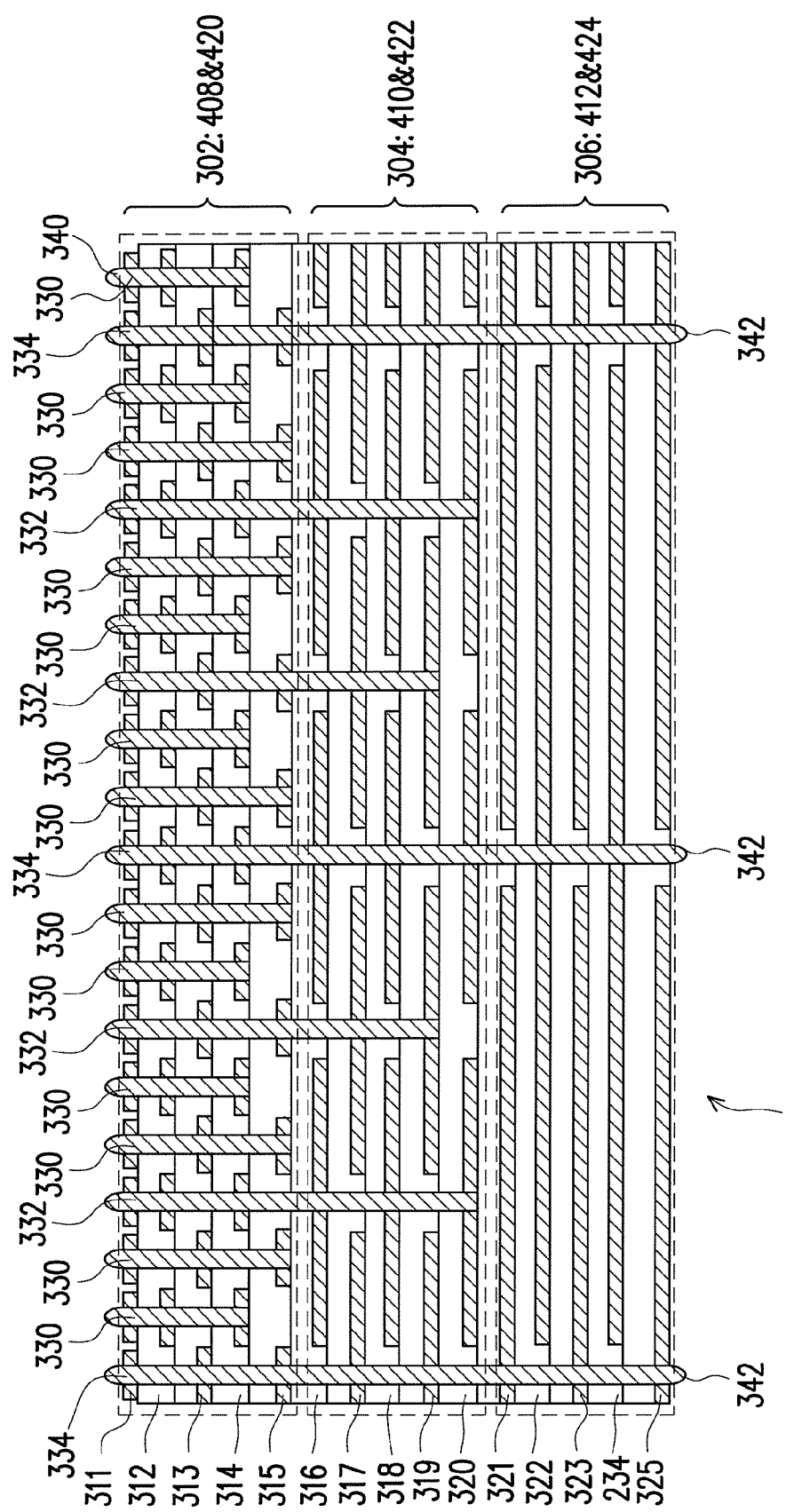
FIG. 3 is a cross-section diagram of a conventional hierarchical capacitor structure.
Figure 4:
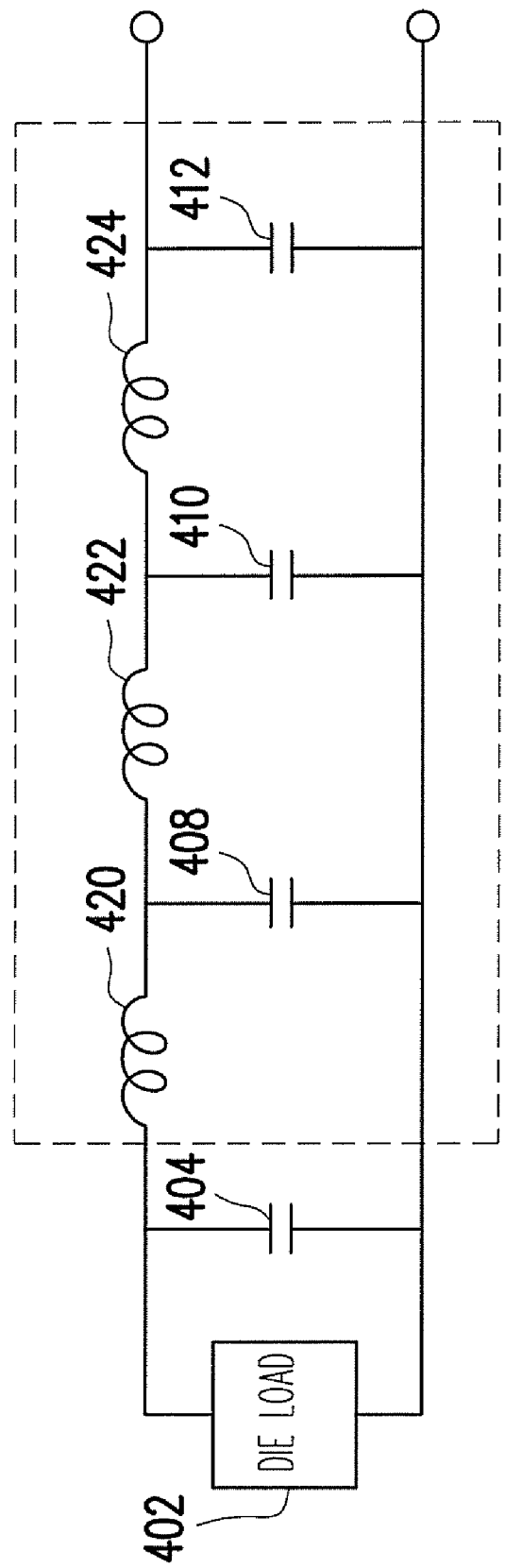
FIG. 4 is the equivalent circuit diagram of FIG. 3.

Reference will now be made in detail to the present preferred embodiments of the invention, examples of which are illustrated in the accompanying drawings. Wherever possible, the same reference numbers are used in the drawings and the description to refer to the same or like parts.

The present invention provides a stepwise capacitor structure and a substrate employing the stepwise capacitor structure, where current-drawing points of a die load may be paired with current paths having minimum impedance (i.e. minimum inductance) to achieve an effective parallel connection. In addition, the present invention also provides a method of fabricating a multi-layer stepwise capacitor structure capable of improving production yield and changing capacitance based on requirement.

In one embodiment, the present invention provides a stepwise capacitor structure and a substrate having the stepwise capacitor structure. In one embodiment, the stepwise capacitor structure includes a lower conductive layer, a middle dielectric layer, and an upper conductive layer, wherein at least one of the two conductive layers has a stepwise structure.

Take the cross section of the lower conductive layer of the stepwise capacitor structure of the present invention as an example for illustration. The term "stepwise" is defined for example as a multi-tier stepwise. In the multi-tier stepwise structure, the lower conductive layer includes at least a first step and a second step. The first step has a first upper surface and the second step has a second upper surface which is higher than the first upper surface. In one embodiment, the second step may be disposed on a surface of the first step. In another embodiment, there may be a plurality of second steps disposed next to one another at a distance on the first upper surface of the first step.

The plurality of second steps may be disposed by groups according to height (steps of the same height are grouped together), for example. There may be multiple groups of various heights of steps. This is given as an exemplary embodiment. There may be different configurations according to different designs (e.g. patterns of the second steps), which still fall within the scope of the present invention.

Moreover, in another embodiment, the multi-tier stepwise structure further includes a third step disposed on the first upper surface of the first step and having a third upper surface. The third step is adjacent to the second step. The third upper surface is higher than the second upper surface. In one embodiment, the third step is disposed next to the second step at a distance. In another embodiment, the third step may be disposed on the second upper surface of the second step.

The cross section of the upper conductive layer in the stepwise capacitor structure of the present invention may also be of inverse stepwise, for example, an inverse multi-tier stepwise structure. In one embodiment, the inverse stepwise includes at least a first inverse step and a second inverse step. The first inverse step has a first lower surface and the second inverse step has a second lower surface. The second lower surface is lower than the first lower surface.

The second lower surface of the second inverse step of the upper conductive layer of the stepwise capacitor structure of the present invention is disposed opposite to the second upper surface of the second step of the lower conductive layer such that capacitance generated from the capacitor structure of the upper conductive layer and the lower conductive layer may be adjusted based on a need.

The second lower surface of the second inverse step of the upper conductive layer of the stepwise capacitor structure of the present invention may also be disposed with a displacement to the second upper surface of the second step of the lower conductive layer such that the capacitance may also be adjusted based on a need.

Height of the second lower surface of the second inverse step of the upper conductive layer may be designed to be lower than height of the second upper surface of the second step of the lower conductive layer. Such design, in one embodiment, the second inverse step and third inverse step of the upper conductive layer are disposed opposite to and made thicknesses complementary to the second step and third step of the lower conductive layers.

The "inverse stepwise," in one embodiment, further includes a third inverse step having a third lower surface. The third inverse step may be disposed under the first lower surface of the first inverse step and adjacent to the second inverse step. In one embodiment, the third lower surface is lower than the second lower surface of the second inverse step. In one embodiment, the third inverse step and the second inverse step are disposed next to each other at a distance. Alternatively, in another embodiment, the third inverse step is disposed under the second lower surface of the second inverse step. In other words, the second inverse step and the third inverse step form a stack structure.

In the stepwise capacitor structure of the present invention, the capacitance may be adjusted by designing the structures of the upper conductive layer and the lower conductive layer. In another embodiment, a plurality of regions or layers of various dielectric constants may be disposed between the upper conductive layer and the lower conductive layer so as to form different capacitance values, which may be designed based on a need.

Specific illustrations on the multi-layer stepwise capacitor structure having a hierarchical capacitor effect and the substrate employing the stepwise capacitor structure as well as fabrication method thereof are provided below through various embodiments.

Referring to FIGS. 5A and 5B, they are cross-section diagrams of a multi-tier stepwise capacitor structure according to an embodiment of the present invention. As shown by FIG. 5A, a multi-tier stepwise capacitor structure 500 includes a dielectric layer 540, conductive layers 511, 512, 513, 521, 522 and 523. The conductive layers 511, 512 and 513 herein forms a three-step lower conductive layer and the conductive layers 521, 522 and 523 forms a three-step upper conductive layer.

The conductive layers 511, 512, and 513 form a 3-step conductor structure. The conductive layers 521, 522, and 523 also form a 3-step conductor structure. For example, in one embodiment, a cross section thickness of the conductive layer 511 may be the same as or different from a cross section thickness of the conductive layers 512 and 513, depending on design requirement. The cross section thickness of the conductive layer 512 may be the same as or different from the cross section thickness of the conductive layer 513, depending on design requirement. Certainly, all embodiments of the present invention are not limited to the above-mentioned relationships.

The capacitor 510 is defined by the dielectric layer 540 and the conductive layers 513 and 523. The capacitor 520 is defined by the dielectric layer 540 and the conductive layers 512 and 522. The capacitor 530 is defined by the dielectric layer 540 and the conductive layers 511 and 521. It can be seen from FIG. 5A, a person skilled in the art should know that the capacitances are changeable by changing the surface areas of or the distance between the conductive layers in the capacitor structure.

Referring to FIG. 5B, 551 and 550 herein represent patterned conductive layers; and TC and BC respectively represent top connector and bottom connector. The conductive via 560 and the lower conductive layers 511-533 are electrically connected to one of the ground terminal VSS and the power terminal VCC; and the conductive via 561 and the upper conductive layers 521-523 are electrically connected to another one of the ground terminal VSS and the power terminal VCC. The conductive via 560 or 561 can be electrically connected to other signal terminals of the circuit (not shown). As shown by FIG. 5B, the upper conductive layers 521-523 have a through hole to allow the conductive via 560 passing through; the lower conductive layers 511-513 have also a through hole to allow the conductive via 561 passing through. In the embodiment, the upper conductive layers 521-523 are not electrically connected to the conductive via 560, but are electrically connected to the conductive via 561; the lower conductive layers 511-513 are not electrically connected to the conductive via 561, but are electrically connected to the conductive via 560.

The dielectric layer 541 is located between the conductive layer 550 and the conductive layer 521, and the dielectric layer 542 is located between the conductive layer 551 and the conductive layer 511.

Figure 5D:
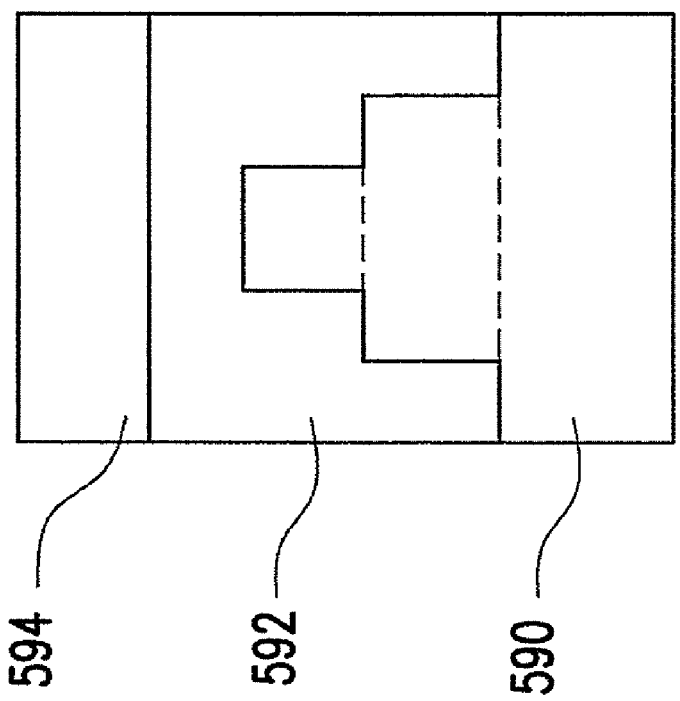
FIG. 5D is a diagram of a 3-tier stepwise conductive layer structure.
Figure 5C:
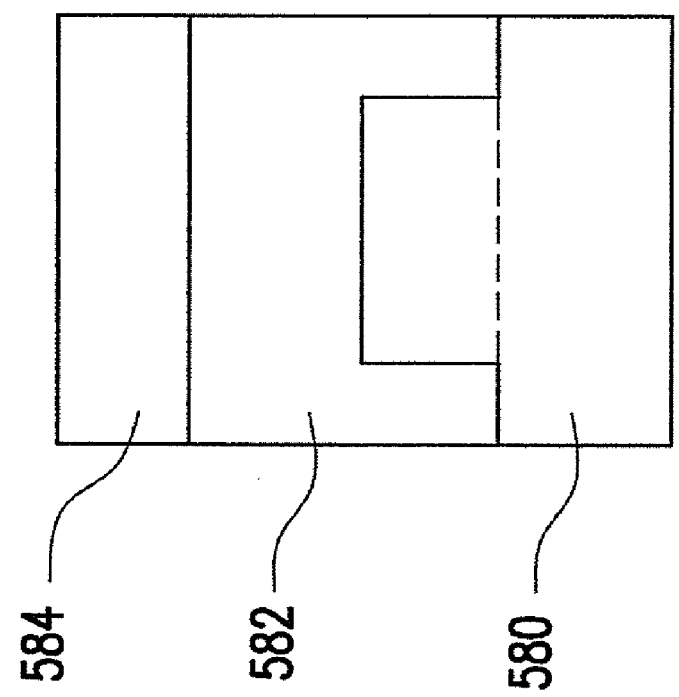
FIG. 5C is a diagram of a 2-tier stepwise conductive layer structure.

In the above description, a so-called 'multi-tier stepwise conductive layer' is defined in FIGS. 5C and 5D. FIG. 5C is a diagram of a 2-step conductive layer structure 580. The multi-tier stepwise capacitor structure of the present embodiment includes a lower conductive layer formed with the 2-step capacitor conductive layer structure 580, a middle dielectric layer 582, and an upper conductive layer 584. FIG. 5D is a diagram of a 3-step capacitor conductive layer structure 590. The multi-tier stepwise capacitor structure of the present embodiment includes a lower conductive layer formed with the 3-step capacitor conductive layer structure 590, a middle dielectric layer 592, and an upper conductive layer 594.

Figure 5E:
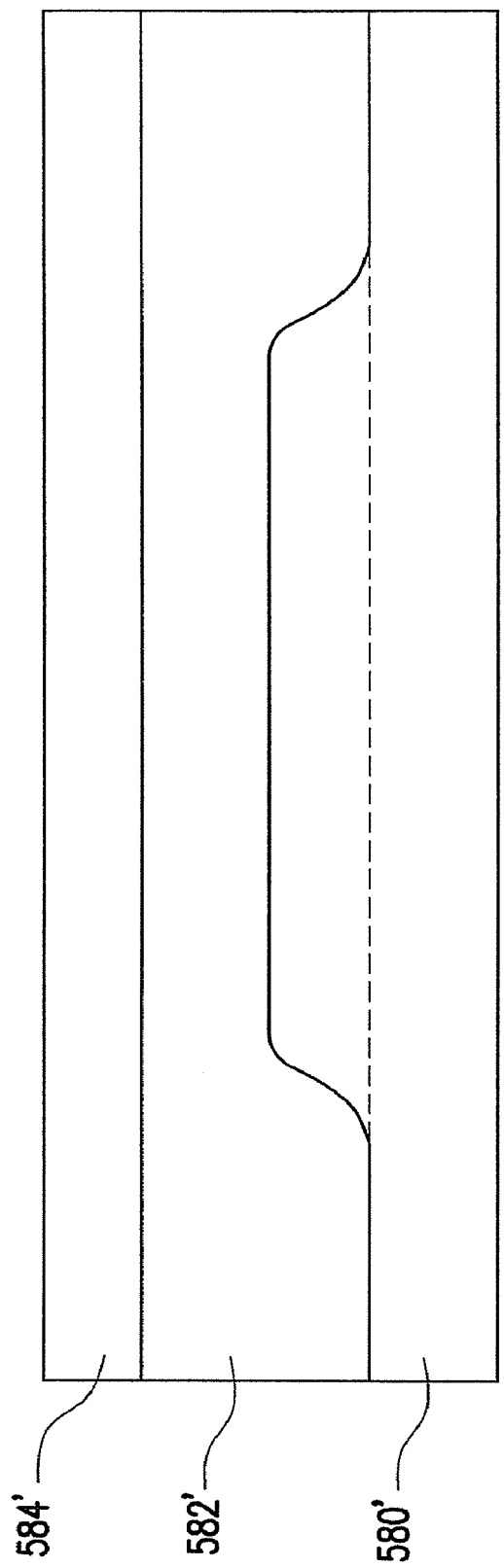
FIG. 5E is a diagram of a 2-tier stepwise conductive layer structure in practice.
Figure 5F:
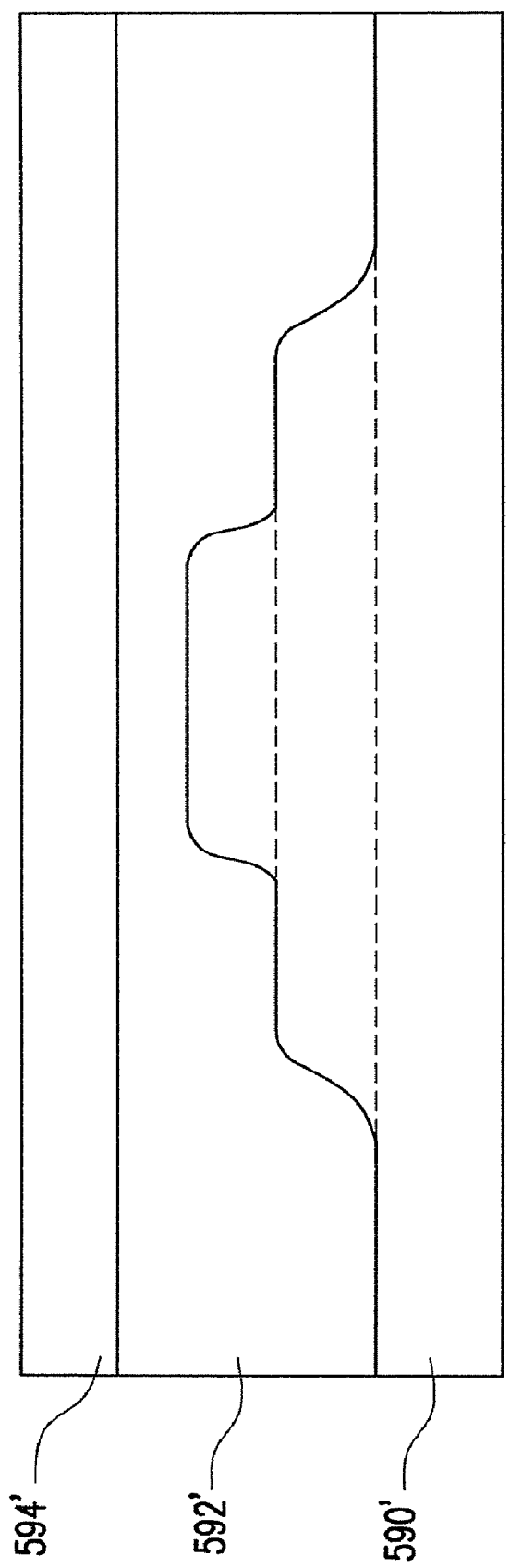
FIG. 5F is a diagram of a 3-tier stepwise conductive layer structure in practice.

Refer to FIGS. 5E and 5F for a cross sectional schematic diagram of a "multi-tier stepwise conductive layer" formed by an actual fabrication process. FIG. 5E illustrates an actual 2-step capacitor conductive layer structure 580'. The multi-tier stepwise capacitor structure of the present embodiment includes a lower conductive layer formed with the 2-steo capacitor conductive layer structure 580', a middle dielectric layer 582', and an upper conductive layer 584'. FIG. 5F illustrates an actual 3-step capacitor conductive layer structure 590'. The multi-tier stepwise capacitor structure of the present embodiment includes a lower conductive layer formed with the 3-step capacitor conductive layer structure 590', a middle dielectric layer 592', and an upper conductive layer 594'.

Figure 6A:
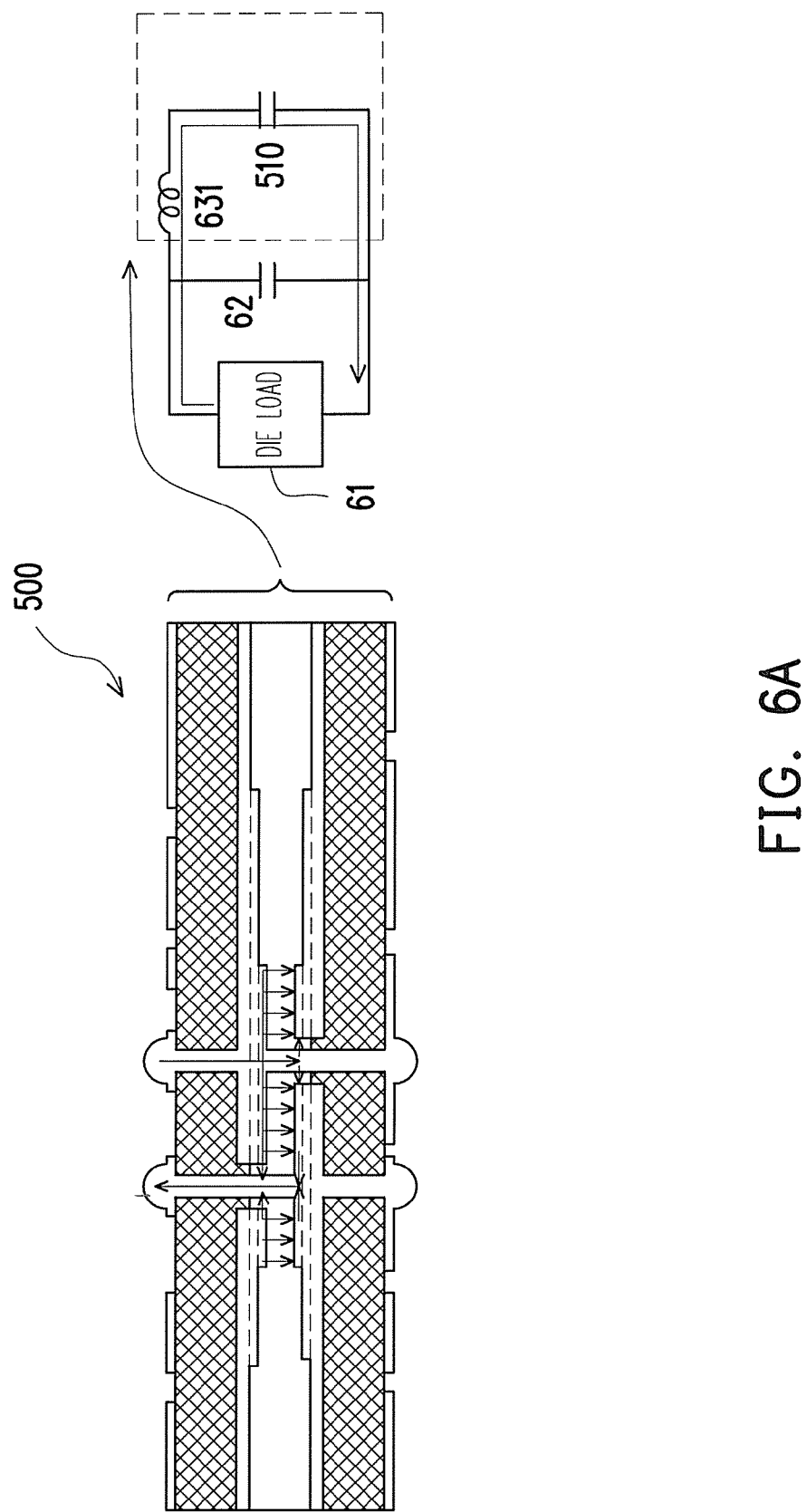
FIGS. 6A-6C are diagrams showing the current paths of the capacitor structure of FIG. 5 respectively corresponding to high-frequency, medium-frequency and low-frequency and the equivalent circuits thereof.
Figure 6B:
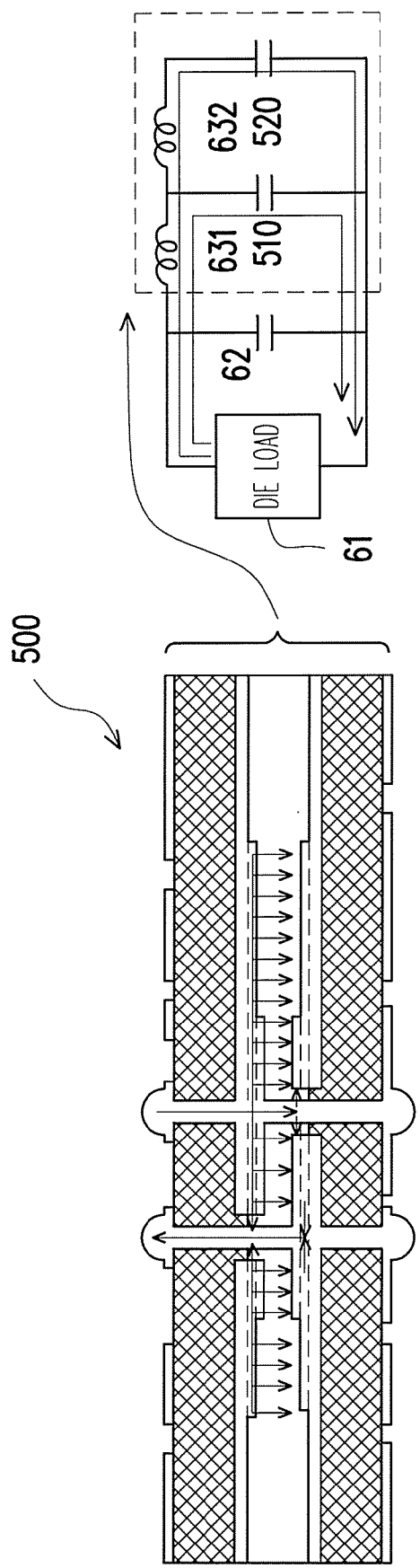
Figure 6C:
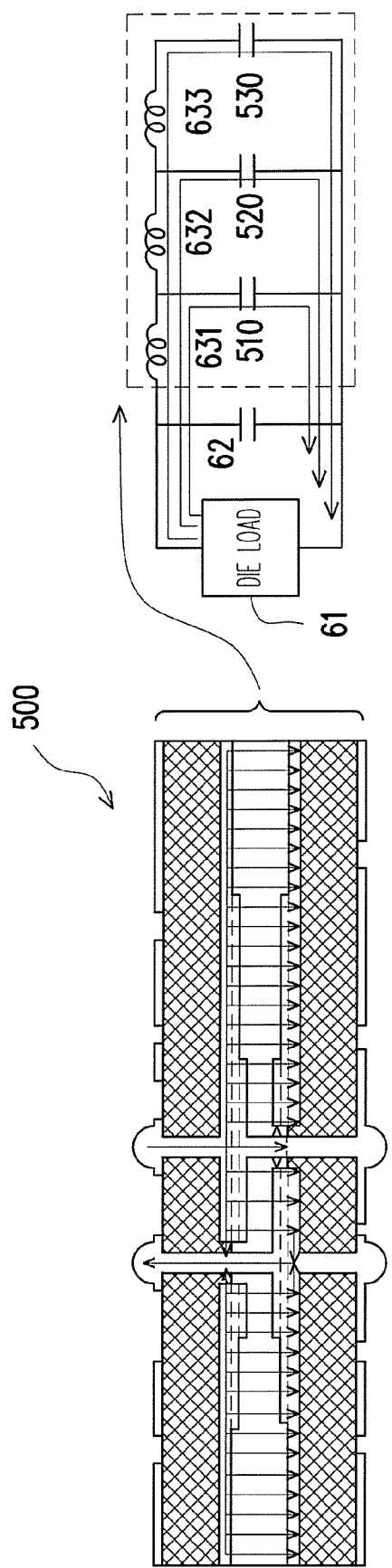
Figure 7A:
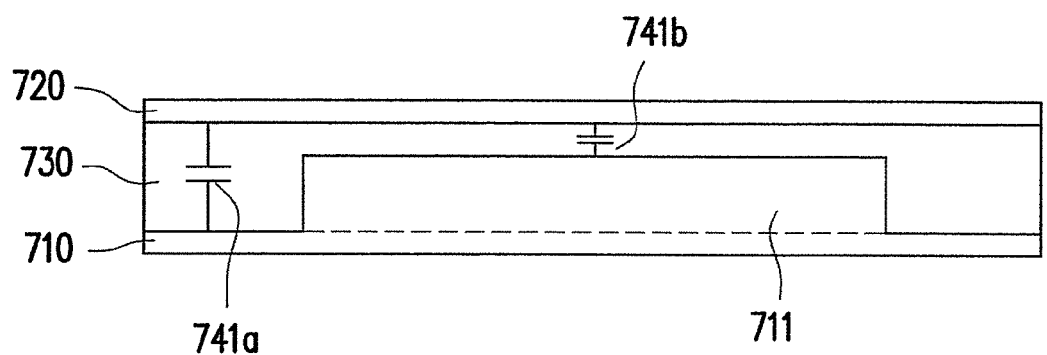
FIGS. 7A-7F are diagrams of modifications of the capacitor structure in the embodiment.
Figure 7B:
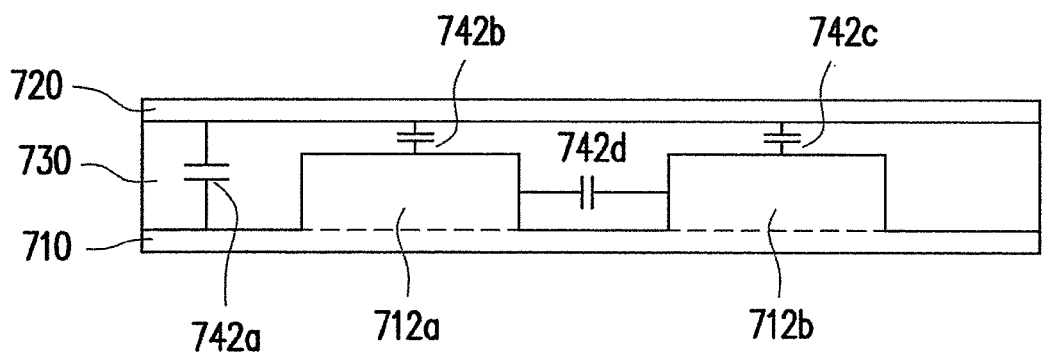
Figure 7C:
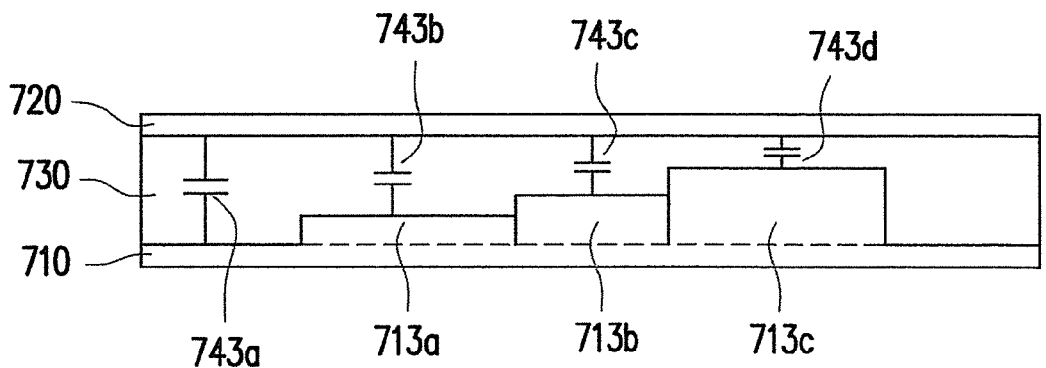
Figure 7D:
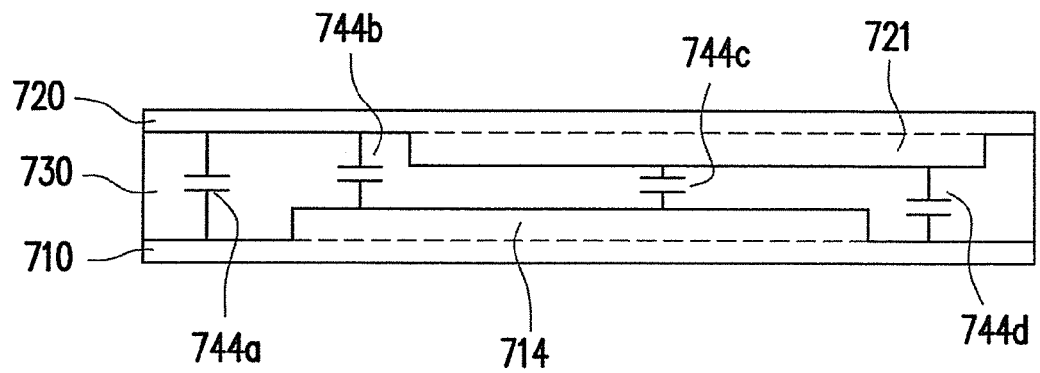
Figure 7E:
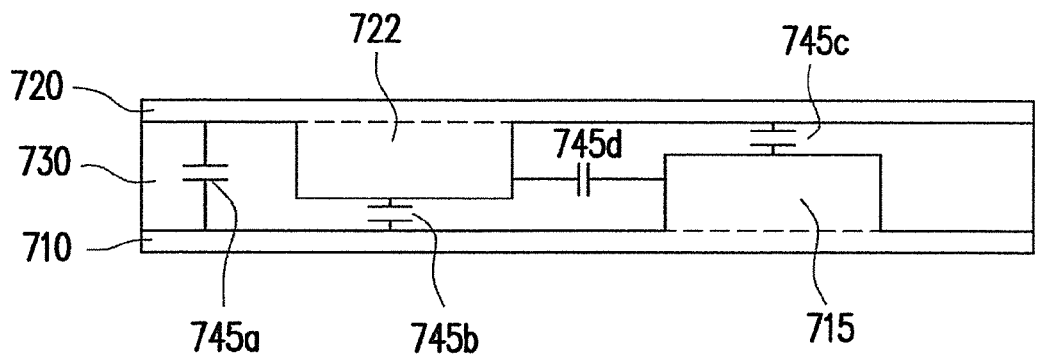
Figure 7F:
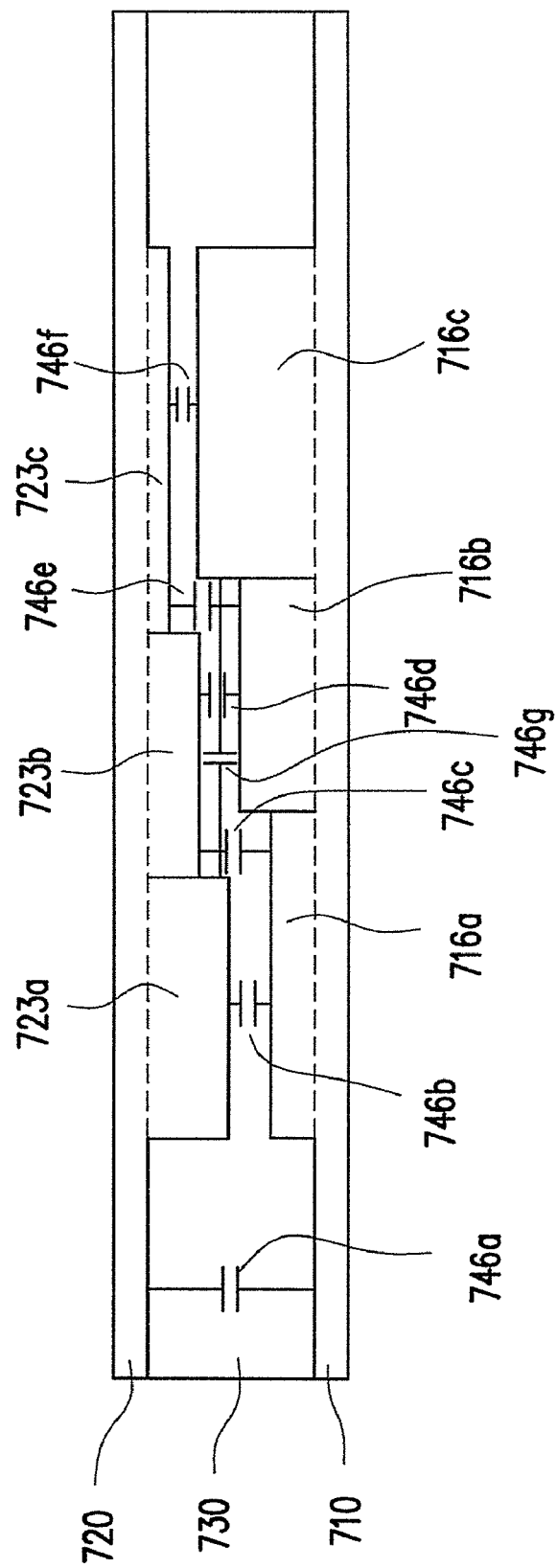

FIGS. 6A-6C are diagrams showing the current paths of the capacitor structure of FIG. 5 respectively corresponding to high-frequency, medium-frequency and low-frequency and the equivalent circuits thereof. The component 62 herein represents the on-chip capacitor of a chip (not shown). The current paths respectively passing through the capacitors 510-530 are represented respectively by inductors 631-633. It can be seen from FIGS. 6A-6C, the inductors 631-633 are subject to: 633>632>631.

As shown by FIG. 6A, when the die load 61 needs to draw high-frequency current, the capacitor 510 is able to provide high-frequency current, wherein the high-frequency noise can be suppressed by the capacitor 510 and the small inductor 631. As shown by FIG. 6B, when the die load 61 needs to draw medium-frequency current, the capacitors 510 and 520 are able to provide medium-frequency current, wherein the medium-frequency noise can be suppressed by the capacitor 510, the small inductor 631, the capacitor 520 and the medium inductor 632. As shown by FIG. 6C, when the die load 61 needs to draw low-frequency current, the capacitors 510-530 are able to provide low-frequency current, wherein the low-frequency noise can be suppressed by the capacitor 510, the small inductor 631, the capacitor 520, the medium inductor 632, the capacitor 530 and the large inductor 633.

In short, the multi-tier stepwise capacitor structure of FIG. 5 is able to effectively suppress high-frequency noise, medium-frequency noise and low frequency noise so as to achieve the effect of suppressing wideband frequency.

FIGS. 7A-7F are diagrams of modifications of the capacitor structure in the embodiment. Reference numbers 710-723c represent patterned conductive layers, 730 represents a dielectric layer and 741a-746f represent capacitors. Taking FIG. 7A as example, the conductive layers 710 and 720 define a capacitor 741a, and the conductive layers 711 and 720 define another capacitor 741b. The conductive layer 710 and the conductive layer 720 forms a 2-step lower conductive layer's multi-tier stepwise capacitor structure of the present invention. A cross section of the conductive layer 710 may be multi-tier stepwise, a cross section of the conductive layer 720 may be inverse multi-tier stepwise, or the cross sections of the conductive layers 710 and 720 may respectively be multi-tier stepwise or inverse multi-tier stepwise. Various multi-tier stepwise structures on the conductive layer 710 or inverse multi-tier stepwise structure of the conductive layer 720 may be disposed in opposite aligned positions, in misaligned positions, or in opposite positions complementary by thickness, depending on design requirement and not to be limited herein. In addition, conductive layers 712a and 712b may be disposed in groups. For example, conductive layers of a same height may be grouped together and spaced at a distance, and there may be a plurality of groups of various heights of steps. It should be appreciated this is merely an exemplary embodiment. Various dispositions according to different designs are possible (e.g. disposition of the plurality of the conductive layers 712a and 712b according to patterns thereof) and fall within the scope of the present invention. In addition, the positions of the conductive layers are not necessarily symmetrical to each other about the dielectric layer 730, and the thicknesses of the conductive layers are not necessarily the same. For example, In FIG. 7D, the positions of the conductive layers 714 and 721 are misaligned with each other; in FIG. 7C, the thicknesses of the conductive layers 713a-713c are not the same; in FIG. 7E, the thicknesses of the conductive layers 715 and 722 are not necessarily the same.

Besides, by alternately arranging the upper hierarchical conductive layers and the lower hierarchical conductive layers, the side walls between the upper/lower hierarchical conductive layers would form capacitors, such as the capacitor 742d (FIG. 7B), 745d (FIG. 7E) and 746g (FIG. 7F), which makes the overall capacitance increased. In one of the above-mentioned embodiment, when side walls of the upper and lower conductive layers are used to form capacitance, isolation must be formed between corresponding conductive layers to generate the capacitance effect. For example, in FIG. 7E, lower conductive layers 710, 715 form a 2-step conductive layer; the steps may be formed by etching or other removal method. Upper conductive layers 720, 722 form a 2-step conductive layer; the steps may be formed by etching or other removal method. The overlapped sidewall of the two stepwise conductive layers may thereby generate a side capacitance effect 745d as shown. When the upper/lower hierarchical conductive layers are alternately arranged, the polarities of the hierarchical conductive layers are accordingly arranged alternately. This would generate very small inductance because the magnetic fields are counteracted by each other and this would significantly contribute to enhance the high-frequency performance of the capacitor component.

Figure 8:
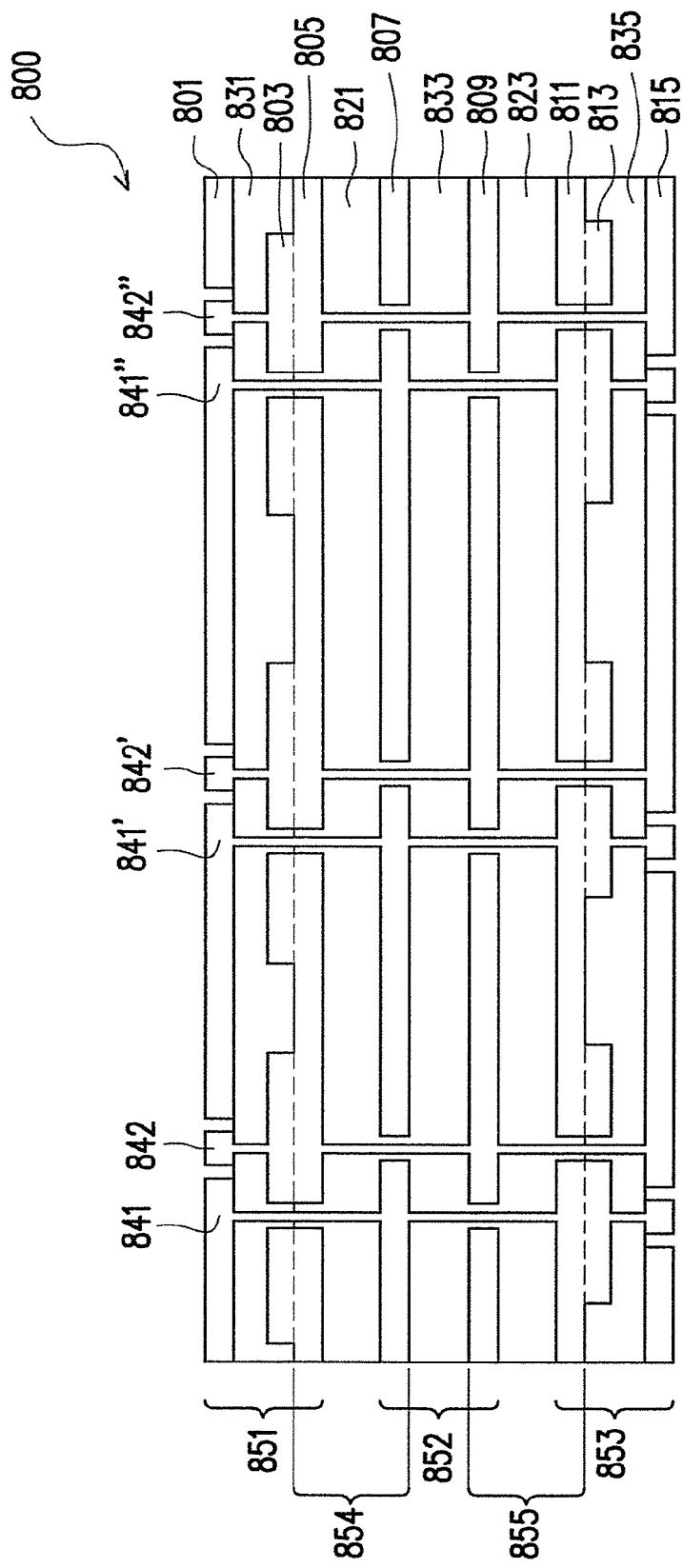
FIG. 8 is a diagram of a multi-layer multi-tier stepwise capacitor structure 800 according to another embodiment of the present invention.

FIG. 8 is a diagram of a multi-layer stacked multi-tier stepwise capacitor structure 800 according to another embodiment of the present invention. The capacitor structure 800 includes conductive layers 801-815, dielectric layers 821, 823, and 831-835 and conductive vias 841, 842, 841', 842', 841", and 842". The capacitor structure 800 includes multi capacitor structures, i.e., 851, 852, 853, 854 and 855. The capacitor structure 851 is defined by conductive layers 801, 803 and 805 and a dielectric layer 831, and analogically for the capacitor structures 852-855. In addition, the dielectric layer 821 can further be used to bind the capacitor structures 851 and 852, and the dielectric layer 823 can further be used to bind the capacitor structures 852 and 853. To be served as a dielectric layer in a metal-insulator-metal (MIM) capacitor structure, the dielectric layers 821 and 823 may be made of a material with dielectric constant (high Dk).

Note that both the capacitor structures 851 and 853 both located at the surface layer of the capacitor structure 800 in FIG. 8 are multi-tier stepwise capacitor structures, and although the capacitor structure 852 located at an inner layer of the capacitor structure 800 is not a multi-tier stepwise capacitor structure, the structure of FIG. 8 comprises two layers of multi-tier stepwise capacitors.

Figure 9A:
FIGS. 9A-9H are diagrams showing the fabrication process of a multi-tier stepwise capacitor structure according to another embodiment of the present invention.
Figure 9B:
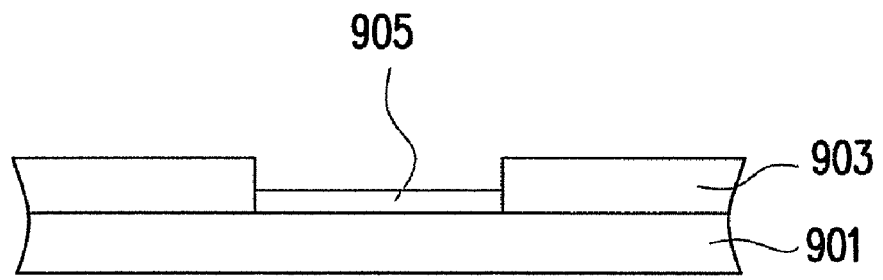
Figure 9C:
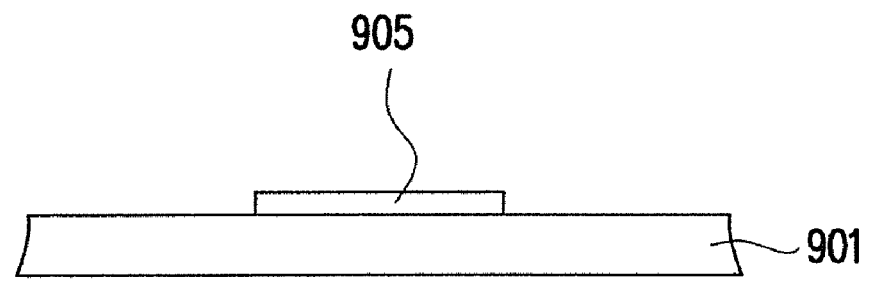
Figure 9D:
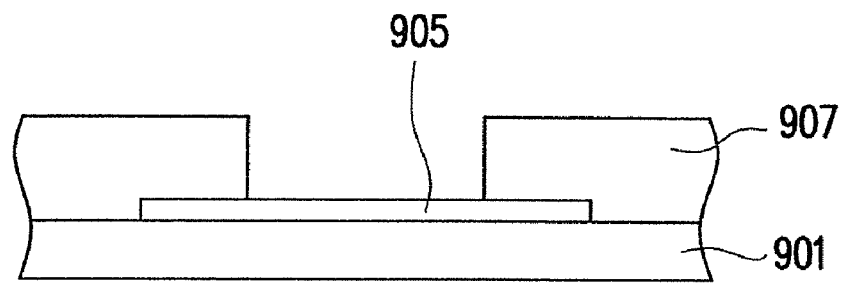
Figure 9E:
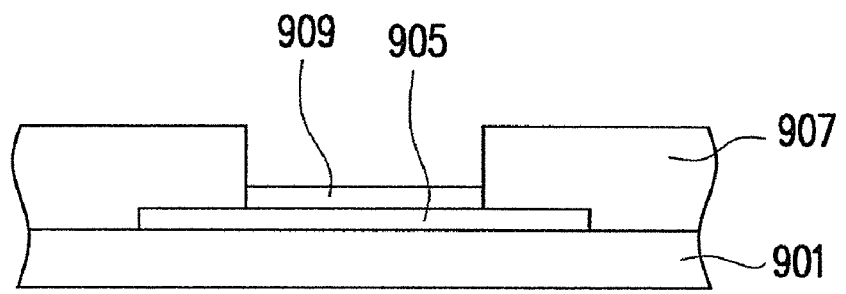
Figure 9F:
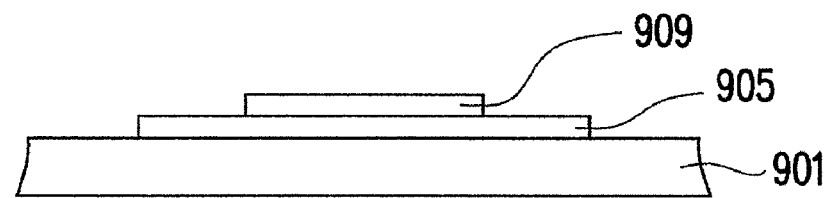
Figure 9G:
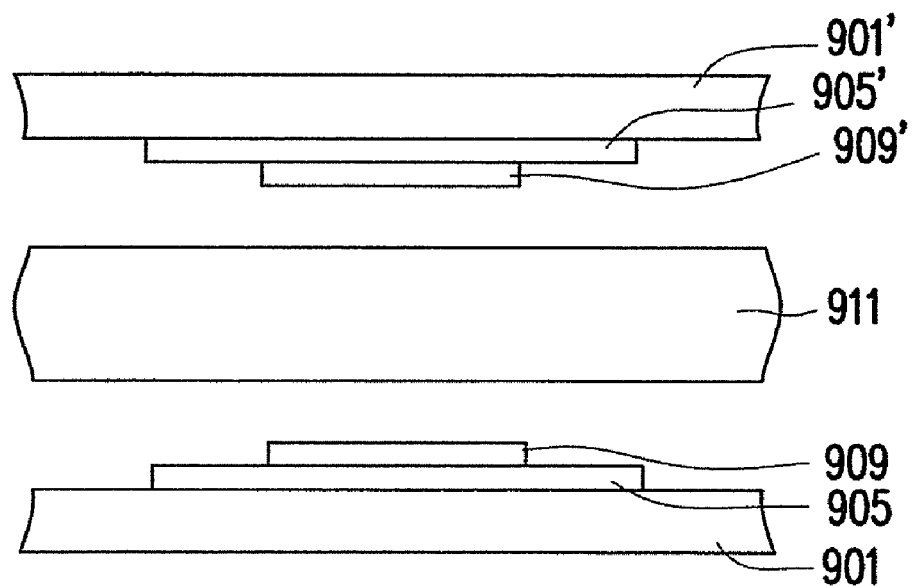
Figure 9H:
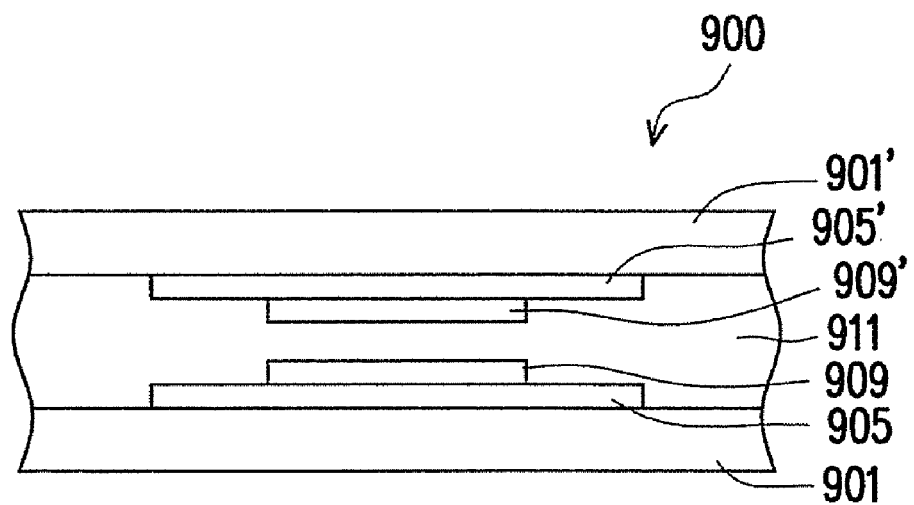

FIGS. 9A-9H show the fabrication process of a multi-tier stepwise capacitor structure according to an embodiment of the present invention. As shown by FIG. 9A, first, a resistive film 903 is formed on a copper foil 901 (conductive layer) by dry film press bounding, followed by patterning and etching the resistive film 903 to form a trench; FIG. 9B shows a second conductive material 905 filled in the trench. In another embodiment, the barrier film 903 may be formed on the conductive layer 901 (copper foil) by immersion, for example by a wet film, which is not to be limited herein. Next in FIG. 9B, another conductive layer 905 is combined with the conductive layer 901, and the conductive layers 901 and 905 form multi-tier structures. Then in FIG. 9C, the resistive film 903 is stripped away, where a two-step conductive layer structure is completed. After that, in FIG. 9D, a resistive film 907 is formed on the dielectric layers 901 and 905, followed by patterning and etching the resistive film 907 to form a trench. Further in FIG. 9E, another conductive layer 909 is formed on the conductive layer 905, and the conductive layers 901, 905 and 909 form a 3-step conductive layer structure. Furthermore in FIG. 9F, the resistive film 907 is stripped away, and at the time a 3-step conductive layer structure including conductive layers 901, 905 and 909 is completed. Analogically, the conductive layers 901', 905' and 909' may be made by the process steps as shown by FIGS. 9A-9F. Finally as shown by FIG. 9G, a dielectric layer 911 is used to combine the conductive layers 901-909 and the conductive layers 901'-909' together to form a capacitor structure 900 as shown by FIG. 9H. The conductive layers 909 and 909' are aligned with each other in FIG. 9H, however the conductive layers 909 and 909' can be configured to be misaligned with each other like the arrangement of conductive layers 721 and 714 in FIG. 7D.

The abovementioned FIGS. 9A-9G illustrate method of fabricating the multi-tier stepwise structure of the conductive layers 901~909 and 901'~909', which is only one illustrated method for realizing the present embodiment and is not intended to limit the present invention. The multi-tier stepwise conductive layers may be formed by printing, coating, injecting, or sputtering. In another embodiment, a calendering process can be used to directly press bound the multi-tier stepwise conductive layer structure, or a molding process can be used to mold the multi-tier stepwise conductive layer structures, which all fall within the scope of the present invention.

Figure 10A:
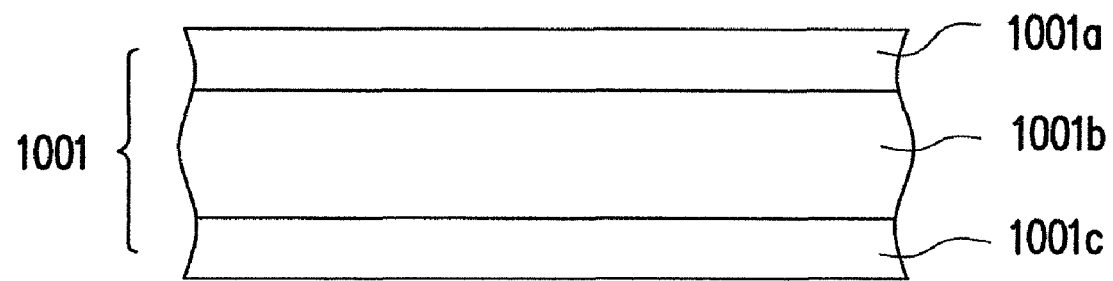
FIGS. 10A-10H are diagrams showing the fabrication process of a multi-tier stepwise capacitor structure according to yet another embodiment of the present invention.
Figure 10B:
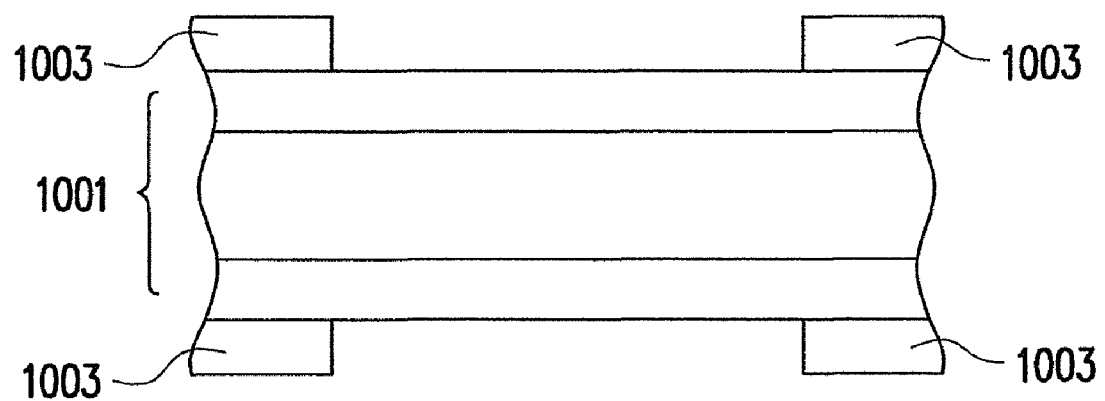
Figure 10C:
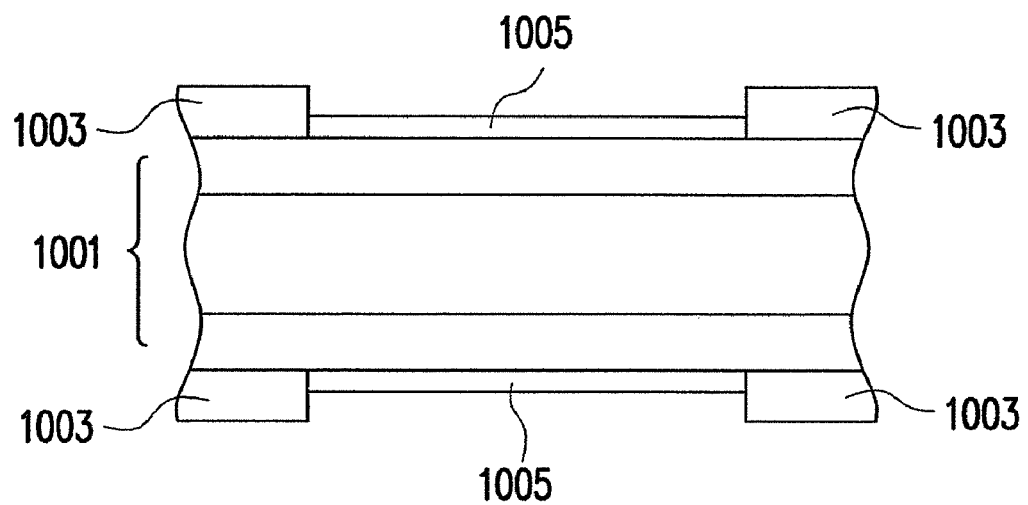
Figure 10D:
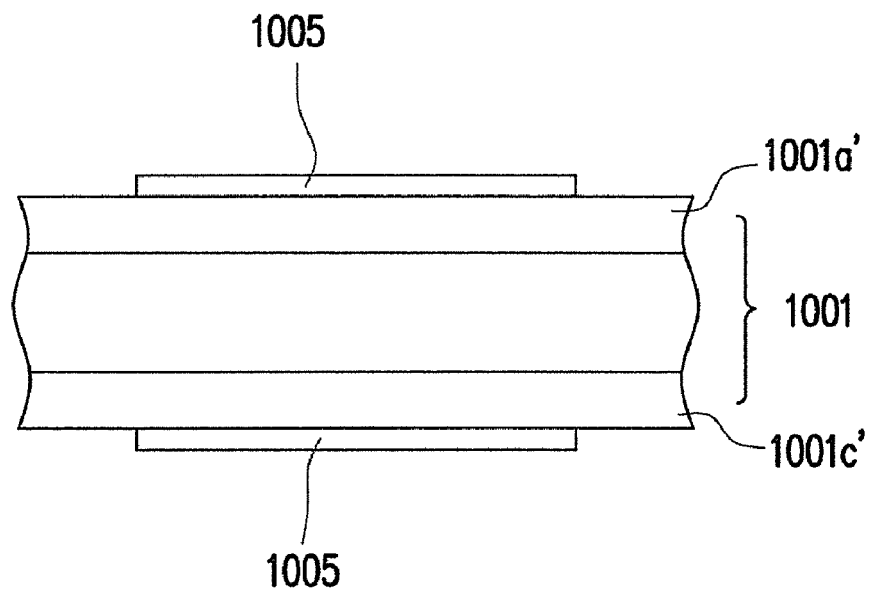

FIGS. 10A-10H are diagrams showing the fabrication process of a multi-tier stepwise capacitor structure according to yet another embodiment of the present invention. First as shown by FIG. 10A, a substrate 1001 is provided, wherein the substrate 1001 includes conductive layers 1001a and 1001c, and a dielectric layer 1001b. Next in FIG. 10B, resistive films 1003 are respectively combined with the upper surface and the lower surface of the substrate 1001, followed by patterning and etching the resistive films 1003 to form trenches. Then in FIG. 10C, conductive layers 1005 are formed in the trenches to combine with the upper surface and the lower surface of the substrate 1001, and the conductive layers 1005 respectively forms a 2-step structure with the conductive layers 1001a and 1001c. After that in FIG. 10D, the resistive films 1003 are stripped away, at the time a 2-step multi-tier stepwise conductive layer structure including conductive layers 1001a/1005 and conductive layers 1001c/1005 is completed.

Figure 10E:
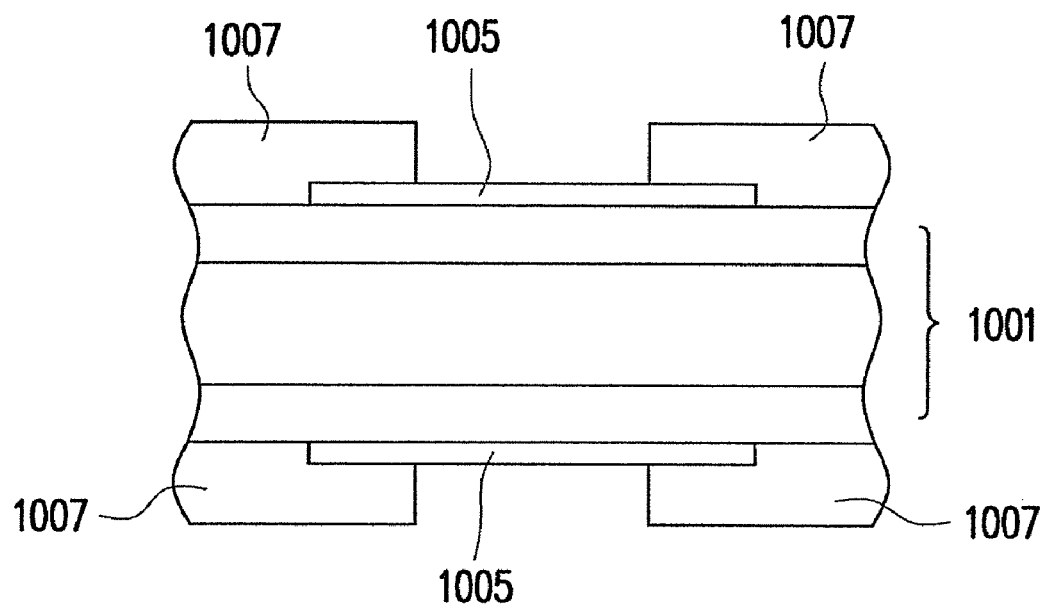
Figure 10F:
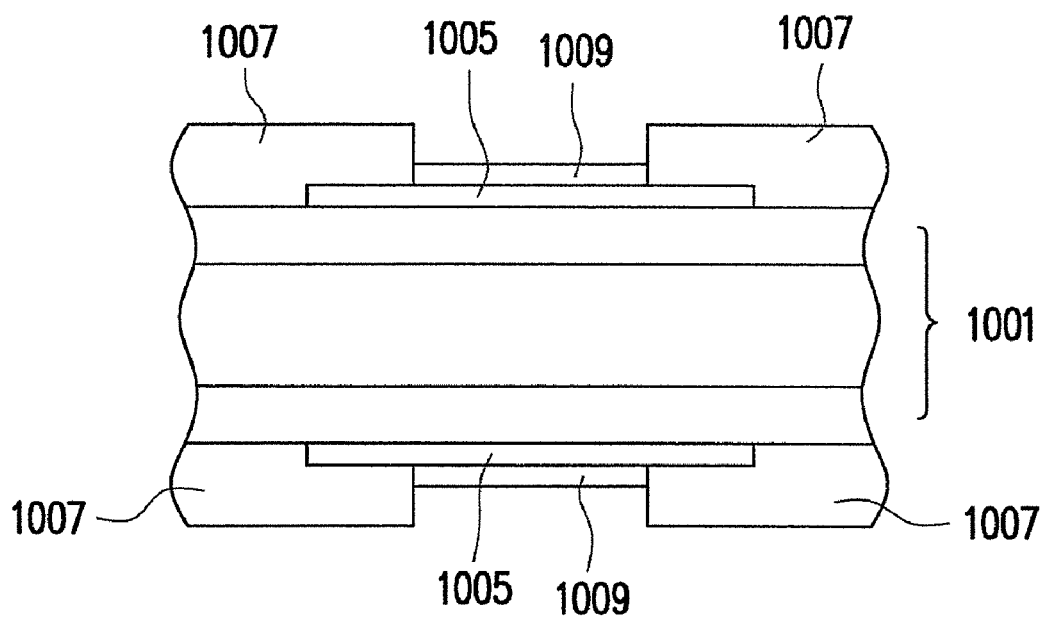
Figure 10G:
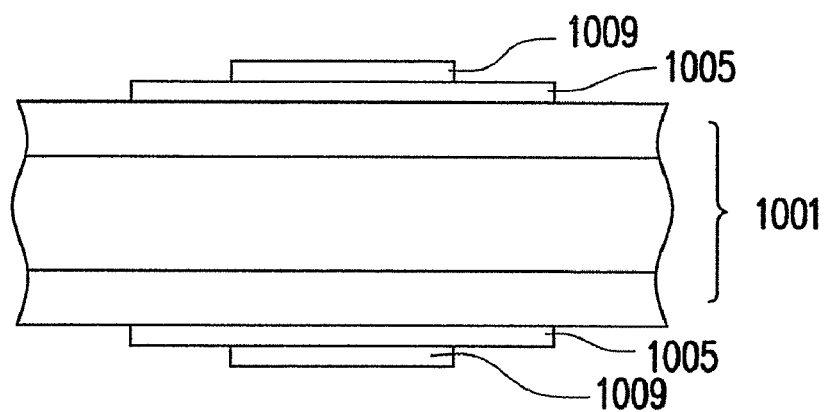
Figure 10H:
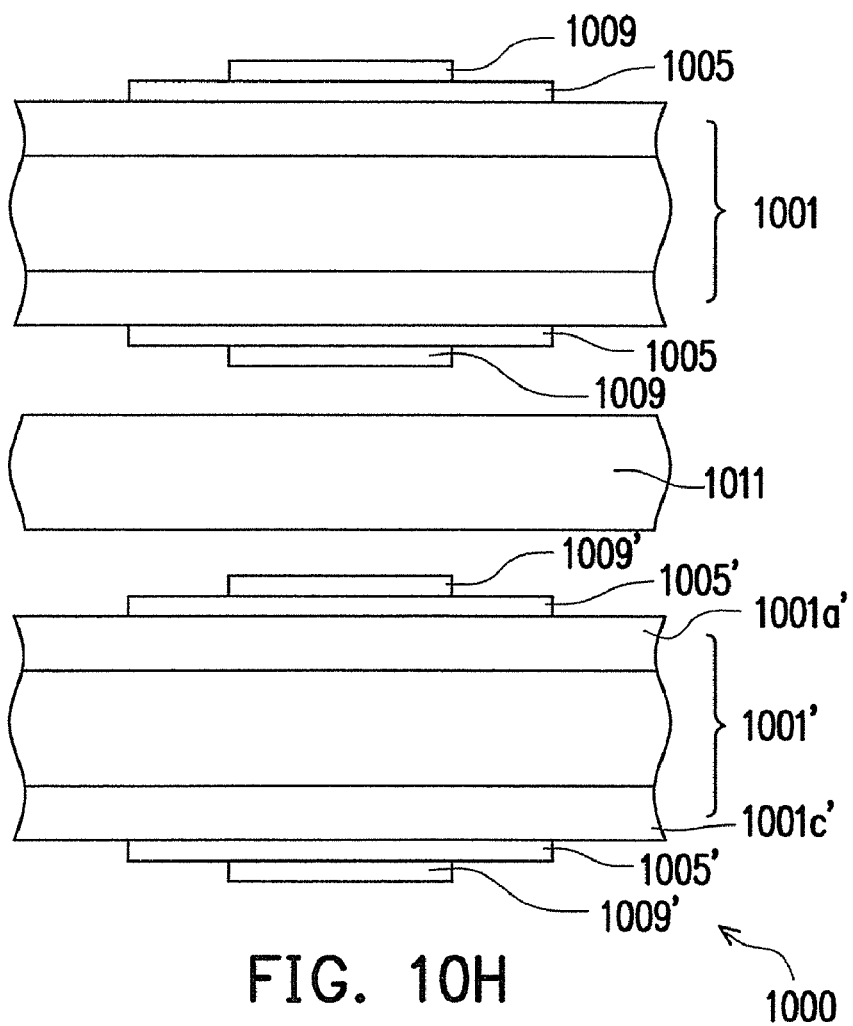

Further in FIG. 10E, resistive films 1007 are formed on the upper and lower surfaces of the substrate 1001, followed by patterning and etching the resistive films 1007 to form trenches. Furthermore in FIG. 10F, conductive layers 1009 are respectively formed in the trenches to combine with the upper conductive layer and the lower conductive layer 1005, where the conductive layers 1009 and the conductive layers 1005 form a 3-step conductive layer structure. Moreover as shown by FIG. 10G, the resistive films 1007 are stripped away to complete a 3-step multi-tier stepwise conductive layer structures respectively including the conductive layers 1001, 1005 and 1009 and the conductive layers 1001, 1005 and 1009. The process steps of fabricating another 3-step conductive layer structure including 1001', 1005' and 1009' may be the same as FIGS. 10A-10G. Finally as shown by FIG. 10H, the capacitor structure 1000 is formed by using a dielectric layer 1011 to combine the conductive layers 1001-1009 and the conductive layers 1001'-1009' together.

Figure 11:
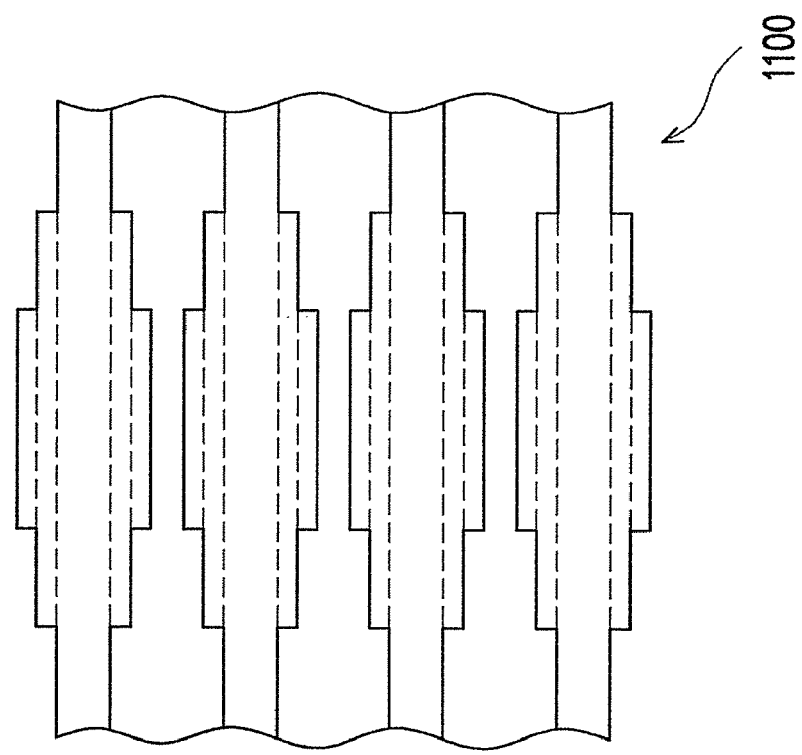
FIG. 11 is a diagram of a capacitor structure 1100 according to another embodiment of the present invention.

FIG. 11 is a diagram of a capacitor structure 1100 according to another embodiment of the present invention. First, for example, the capacitor structure 900 obtained by FIG. 9H is served as a substrate of FIG. 10A. Next, the process of FIGS. 10B-10H are conducted on the capacitor structure 900 to obtain a capacitor structure 1100 as shown by FIG. 11. In the capacitor structure 1100, a desired hierarchical decoupling capacitor structure can be obtained by changing the multi-tier stepwise structure formed in each multi-tier stepwise conductive layer in design. Moreover, a desired hierarchical decoupling capacitor structure can be obtained by changing the effective distances between the upper multi-tier stepwise conductive layers and the lower multi-tier stepwise conductive layers, and even by changing the dielectric layer with different dielectric constant or changing the number of different dielectric layers.

Figure 12:
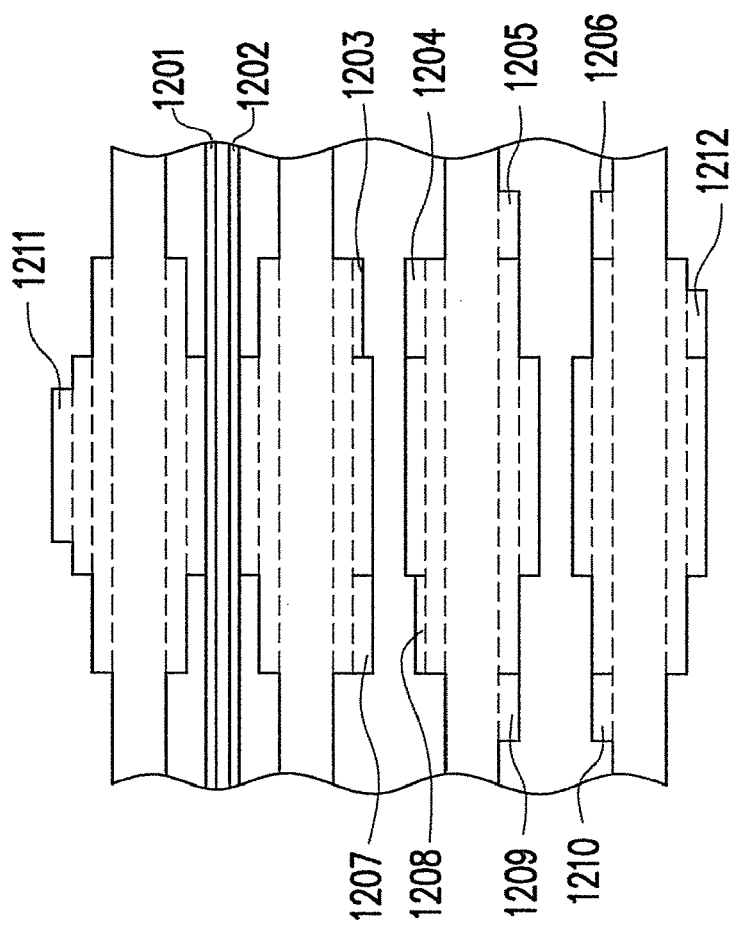
FIG. 12 is a diagram of a capacitor structure 1200 according to yet another embodiment of the present invention.

FIG. 12 is a diagram of a capacitor structure 1200 according to yet another embodiment of the present invention. The dielectric constant of dielectric layers 1201-1212 herein is basically different from that of the dielectric layers 911, 1001b and 1011. For example, after completing the conductive layer 905 and/or the conductive layer 909 in FIGS. 9A-9H, dielectric layers 1201-1210 are formed at proper positions; alternatively, after completing the conductive layers 1005, 1009, 1005' and 1009' as shown by FIGS. 10A-10H, dielectric layers 1211 and 1212 are formed at proper positions.

In the embodiment, the technique of forming the dielectric layer may be, for example but not limited to, implantation, and may also adopt inkjet printing, screen printing, sputtering, coating, press bounding and so on.

In the capacitor structure 1200, the desired capacitance of a hierarchical decoupling capacitor structure can be obtained by changing the multi-tier stepwise structure of each multi-tier stepwise conductive layer, by changing the distances between the upper conductive layer and the lower conductive layer, by changing the dielectric constants of the dielectric layer or the number of the dielectric layers. For example, the dielectric layers 1201-1212 in FIG. 12 use various dielectric constants in different areas or layers on the multi-tier stepwise conductive layer or near to the multi-tier stepwise conductive layer to change the dielectric constants between the upper conductive layer and the lower conductive layer and further design the desired capacitance of a hierarchical decoupling capacitor structure.

In the processes shown by FIG. 9 or FIG. 10, dielectric layers with different dielectric constants can be implanted on the multi-tier stepwise conductive layer or near to the multi-tier stepwise conductive layer, for changing the dielectric constant between the upper conductive layer and the lower conductive layer so as to obtain a desired hierarchical decoupling capacitor structure in design.

A person skilled in the art should know that the processes of FIGS. 9-12 are applicable to fabricate the multi-tier stepwise capacitor structure of FIG. 5 or FIGS. 7A-7F. The processes of FIGS. 9-12 are even applicable to fabricate a multi-layer multi-tier stepwise capacitor structure.

Figure 13:
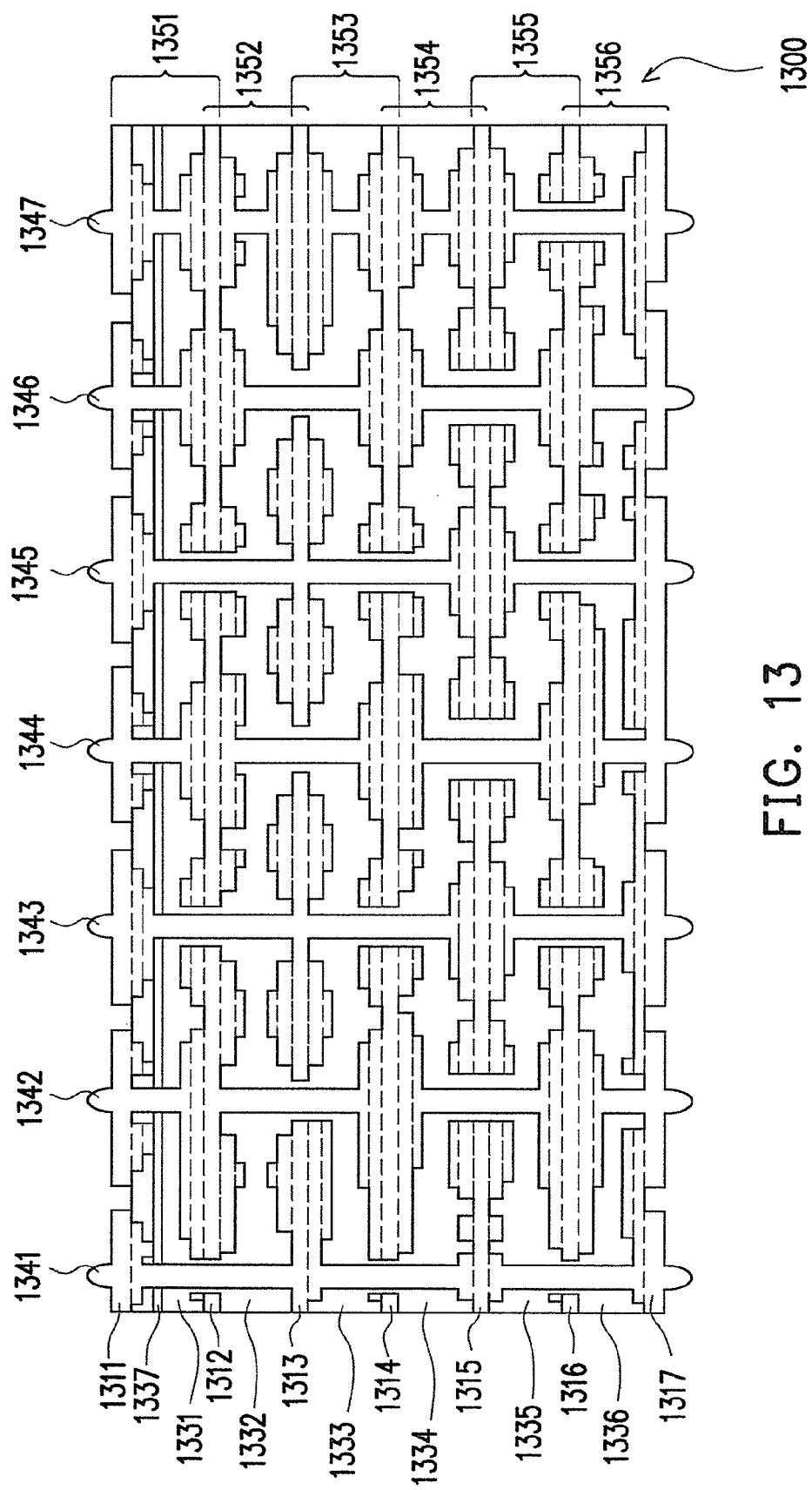
FIG. 13 is a diagram of a multi-layer multi-tier stepwise capacitor structure 1300 according to yet another embodiment of the present invention.

FIG. 13 is a diagram of a multi-layer multi-tier stepwise capacitor structure 1300 according to yet another embodiment of the present invention. A capacitor structure 1300 includes conductive layers 1311-1317, dielectric layers 1331-1336 and conductive vias 1341-1347. The capacitor structure 1300 includes six layers of capacitor structure 1351-1356, wherein the capacitor structure 1351 is defined by conductive layers 1311 and 1312 and a dielectric layer 1311, and analogically for the rest capacitor structures 1352-1356. In addition, the conductive layer 1312 is shared by the capacitor structures 1351 and 1352, and analogically for the rest referring to FIG. 13.

Although the conductive layers 1311-1317 in FIG. 13 are respectively counted as a multi-tier stepwise conductive structure, but a person skilled in the art should know that the present invention is not limited thereto, but requires at least one of the conductive layers is a multi-tier stepwise conductor structure. The method of fabricating the conductive layer can refer to the above-described embodiments. Note that although the conductive vias 1341-1347 in FIG. 13 are through vias, but a person skilled in the art should know that other types of conductive vias can be used in the present invention as well (e.g. blind vias or buried vias), wherein the conductive vias 1341, 1343, 1345 and 1347 are electrically connected to the conductive layers 1311, 1313, 1315 and 1317, and the conductive vias 1342, 1344 and 1346 are electrically connected to the conductive layers 1312, 1314 and 1316.

The dielectric layer 1337 in FIG. 13 (similar to FIG. 12) is disposed on at least one of the conductive layers or near to at least one of the conductive layers, and the dielectric constant of the conductive layer 1337 is substantially different from that of the dielectric layers 1331-1336. As described above, the dielectric layer 1337 with a different dielectric constant is used for changing the effective dielectric constant between the upper conductive layer and the lower conductive layer (for example, between 1311 and 1312 in FIG. 13) to obtain a desired hierarchical decoupling capacitor in design.

In addition, the conductive layers 1311-1317 can be divided into a first group of conductive layers and a second group of conductive layers, wherein the first group of conductive layers includes conductive layers 1311, 1313, 1315 and 1317, the second group of conductive layers includes conductive layers 1312, 1314 and 1316, and the conductive layers 1311, 1313, 1315 and 1417 in the first group of conductive layers and the conductive layers 1312, 1314 and 1316 in the second group of conductive layers are arranged alternately.

According to the embodiment, various desired combinations of capacitors and inductors are able to be formed by using multi-layer multi-tier stepwise capacitor structures. In addition, the multi-layer multi-tier stepwise capacitor structure in association of proper conductive vias can be used to implement the hierarchical decoupling capacitor structure in the previous embodiment to reduce wideband noise based on requirement.

On each layer of the capacitor structure, each conductive via has a different current path and is electrically connected in parallel to different capacitances. In this way, a hierarchical decoupling capacitor structure is established between each conductive via and a reference voltage (for example, the ground terminal). In practice, the conductive vias are corresponding to the pins of the power terminal or the pins of the ground terminal of an electronic circuit and this may establish a hierarchical decoupling capacitor structure between the power terminal and the ground terminal of the circuit.

In fact, the path from each conductive via to the ground terminal or the power terminal can be treated as a capacitor structure with a different capacitance and a different inductance, thus, the electronic circuit can be connected to an appropriate conductive via at a different position if in need.

Figures 14A, 14B, 14C:
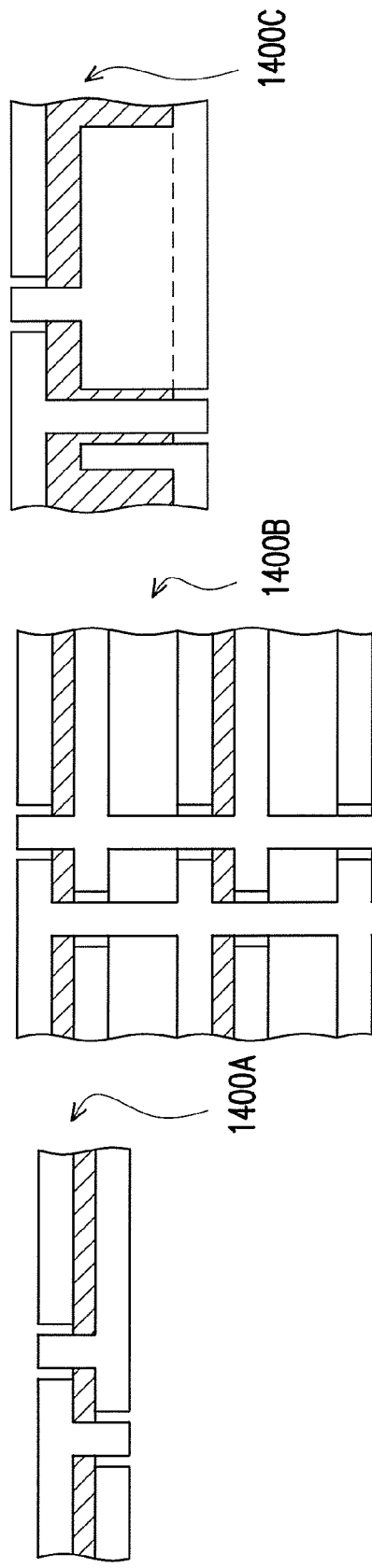
FIG. 14A is a diagram of a conventional single-plate capacitor structure.
FIG. 14B is a diagram of a conventional 3-plate capacitor structure.
FIG. 14C is a diagram of a multi-tier stepwise capacitor structure 1400C according to yet another embodiment of the present invention.
Figure 15:
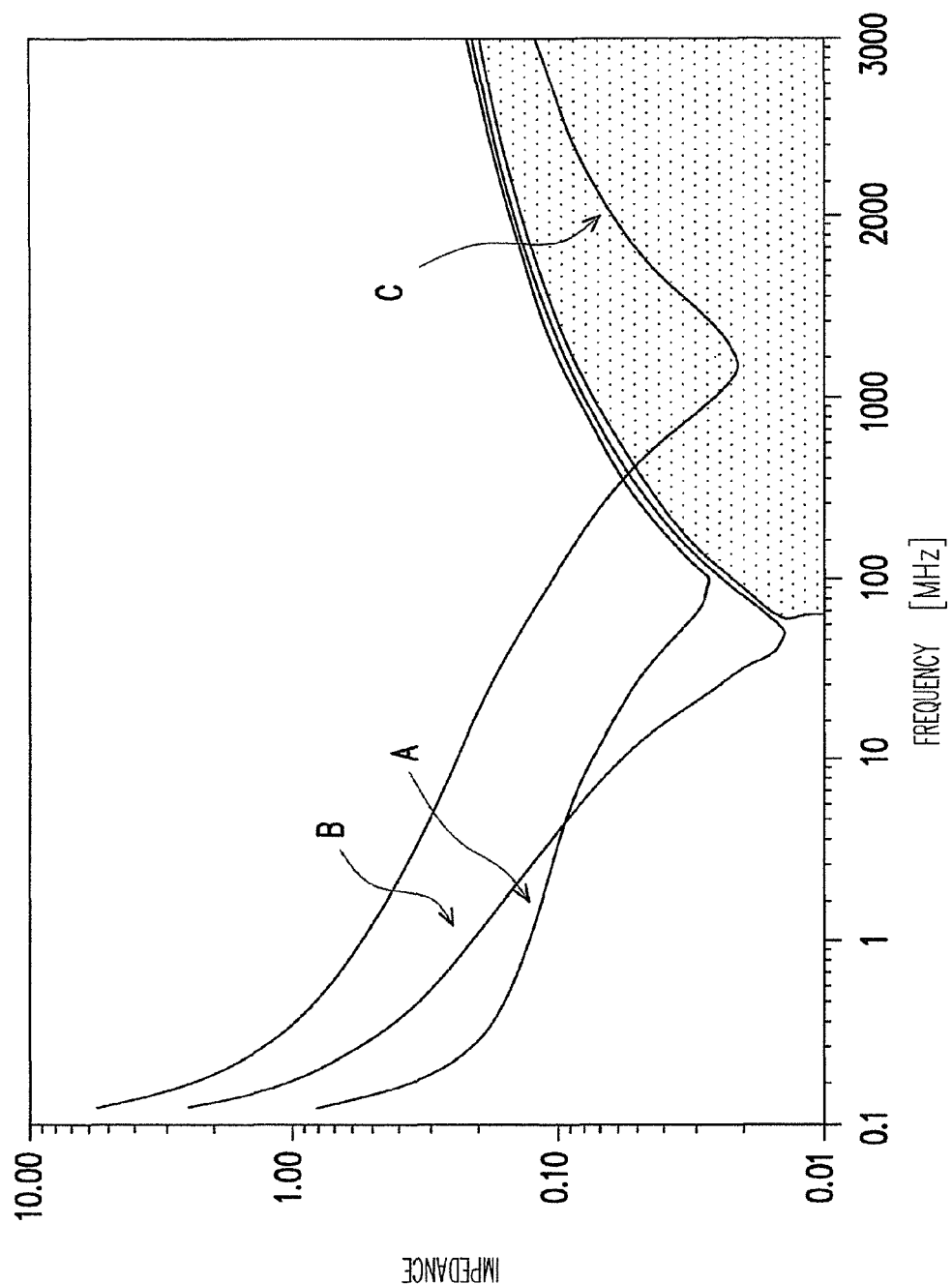
FIG. 15 is a diagram showing the impedance characteristics curves of a capacitor structure of the above-mentioned embodiment and a conventional capacitor structure, respectively.

FIGS. 14A-14C and 15 are given to compare the capacitor structure of the present invention with the conventional capacitor structure. In FIG. 15, relationship curves A-C are respectively corresponding to the capacitor structures of FIGS. 14A-14C.

FIG. 14A is a diagram of a conventional single-plate capacitor structure 1400A, wherein the capacitor structure has conductive vias. When the distance between the upper conductive layer and the lower conductive layer is required to be less than 10 μm, current press bounding process has difficulty in fabricating such an ultra-thin capacitor structure.

FIG. 14B is a diagram of a conventional 3-plate capacitor structure 1400B, wherein the capacitor structure has conductive vias, and the 3-plate capacitor structure 1400B is formed by stacking three single-plate capacitor structure 1400A such that the distance is less than 10 μm. Such an ultra-thin capacitor structure is not easily achieved.

FIG. 14C is a diagram of a multi-tier stepwise capacitor structure 1400C according to yet another embodiment of the present invention, wherein the capacitor structure has conductive vias. It can be seen from the above-mentioned embodiments; the press bounding process of the multi-tier stepwise capacitor structure 1400C may adopt a dielectric layer of thickness greater than 10 μm and then use an embedding technique to achieve a thickness less than 10 μm, which may more easily fabricate an ultra-thin capacitor structure.

The curves A and B in FIG. 15 indicate although the capacitance can be increased by parallel multi-layer, but the inductance can not be changed. It can be seen from the curve C in FIG. 15 however that the capacitor structure provided by embodiments of the present invention have reduced inductance to achieve a hierarchical capacitor having a high-frequency current path flowing through small inductance, a medium-frequency current path flowing through medium inductance and a low-frequency current path flowing through large inductance.

The multi-tier stepwise capacitor structure provided in the embodiments of the present invention may be a capacitor element and used in association with systems of various configurations, for example, by being embedded in substrate, disposed on a substrate, or combined with an integrated circuit package structure. That is, the capacitor, adapting to substrates and packaging structures of different system, may connect a signal in the multi-tier stepwise capacitor structure based on requirement. Illustrations on the present embodiment are detailed below with reference to FIGS. 16A and 16B.

Figure 16A:
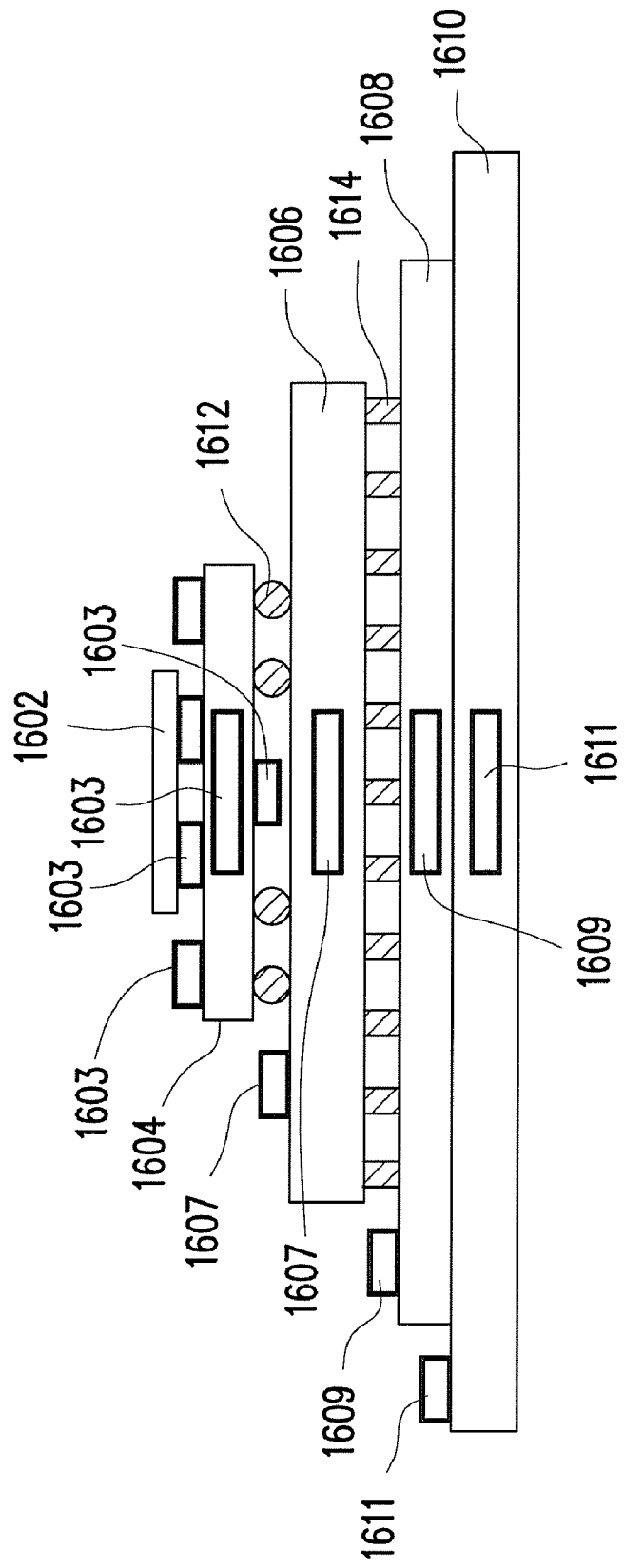
FIGS. 16A and 16B are cross-section diagrams showing an IC package 1604, a silicon interposer 1606, a socket 1608 and a PC board (printed circuit board, PCB) 1610.
Figure 16B:
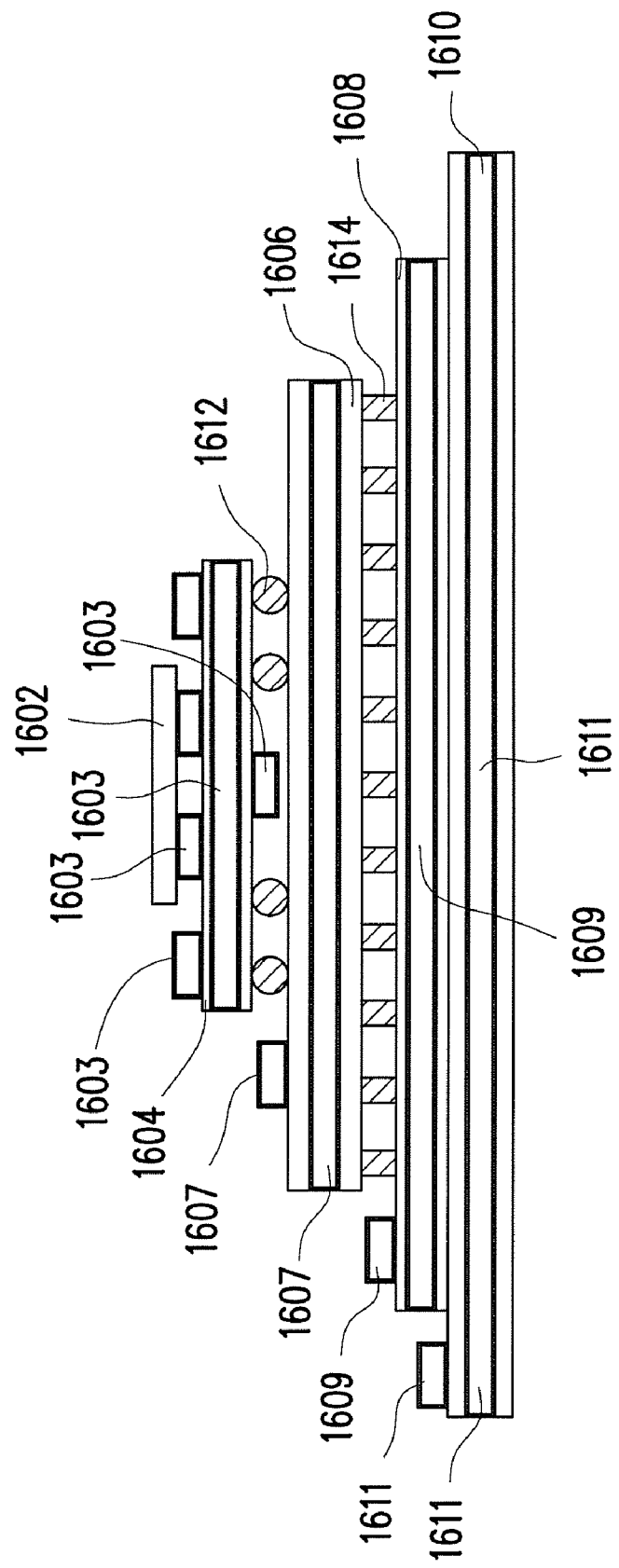

FIGS. 16A and 16B are cross-section diagrams illustrating the multi-tier stepwise capacitor structure in system application structure (e.g. an IC package 1604, a silicon interposer 1606, a socket 1608 and a printed circuit board, 1610.) One or more multi-tier stepwise capacitor structures may be disposed on a surface of, embedded, or integrated into a system application structure as shown in FIG. 16A. The multi-tier stepwise capacitor structure may also be integrated in a system application structure in a form of an entire layer of a substrate as shown in FIG. 16B. One or more multi-tier stepwise capacitor structures provided by the above-described embodiments of the present invention may be disposed on the surfaces of the IC package 1604, the silicon interposer 1606, the socket 1608 or the PC board 1610. "1602" represents an IC. The silicon interposer 1606 can be termed as chip carrier as well, and PCB and chip carrier are counted as one type of substrate. In other words, the one or more multi-tier stepwise capacitor structures of the present embodiment may be adopted in a system application structure which may be in a form of a substrate such as a silicon substrate, a chip carrier, a ceramic substrate, a glass substrate, a flexible substrate, or a printed circuit board. The application may also be a package structure such as an integrated circuit package structure, an SIP (System in Package), an SOP (System on Package), an SOM (System on Module), a 3D Package, a POP (Package on Package), a Carrier Stacking, a socket, and so forth. Alternatively, a substrate including the conductive layer of the multi-tier capacitor may also be combined in an integrated circuit structure package structure.

The capacitor 1603 (marked with a bold line box) can be disposed on the surface of the IC package 1604 (where the capacitor 1603 is counted as a discrete capacitor) in a form of a component or an entire layer or embedded in the IC package 1604 in a form of a component or an entire layer. The capacitors 1607, 1609 and 1611 (marked with bold line boxes) can be disposed on the surfaces of the silicon interposer 1606 and/or the socket 1608 and/or the PC board 1610 (where the capacitors are counted as discrete capacitors) or embedded in the silicon interposer 1606 and/or the socket 1608 and/or the PC board 1610 in a form of a component or an entire layer. In FIGS. 16A and 16B, the locations of the bold line boxes also represent the feasible positions to dispose or embed the capacitors according to the above-described embodiments of the present invention. That is to say, the multi-tier stepwise capacitor structure provided by the above-described embodiments of the present invention can be disposed/embedded in a form of a component (FIG. 16A) or integrated in a system application structure in a form of an entire layer (FIG. 16B).

Figure 17B:
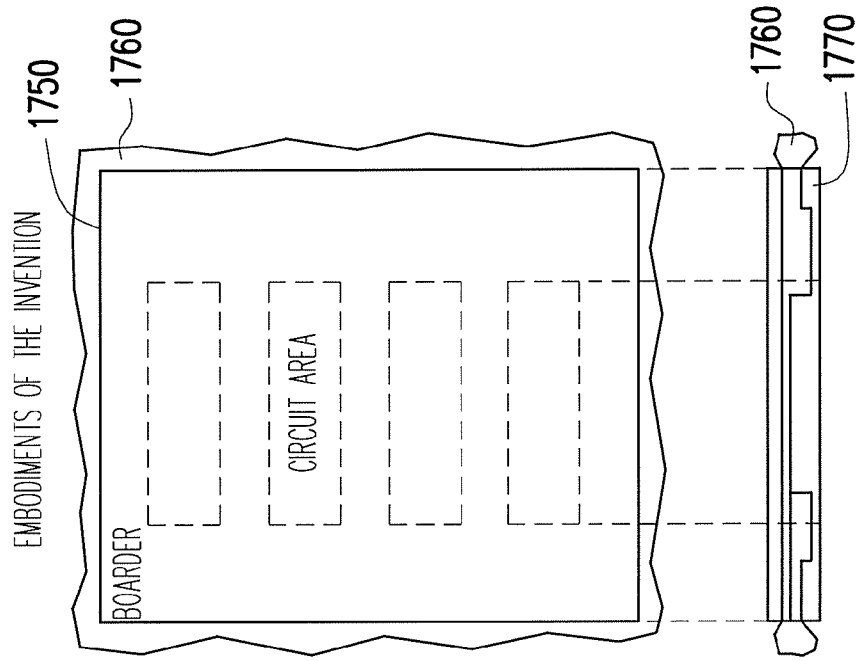
FIG. 17B is a diagram showing the melt flow during fabricating a single-layer multi-tier stepwise capacitor according to the process of an embodiment of the present invention.
Figure 17A:
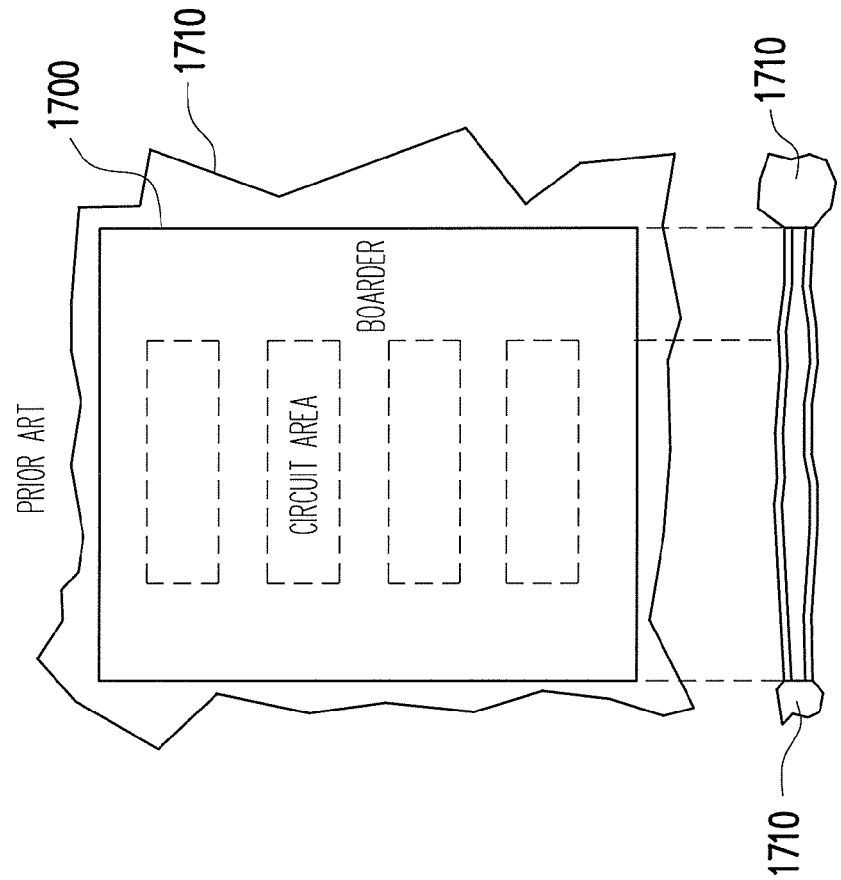
FIG. 17A is a diagram showing the melt flow during fabricating a single-tier plate capacitor according to the conventional process.

FIG. 17A is a diagram showing the melt flow during fabrication of a single-tier plate capacitor according to the conventional process; and FIG. 17B is a diagram showing the melt flow during fabrication of a single-tier plate capacitor according to the above embodiments of the present invention.

As shown by FIG. 17A, in the prior art, at the boarder of a substrate 1700, multi-tier stepwise conductive layers may serve as adhesive obstruction, and therefore, the melt flow in the prior art is uncontrollable. In contrast, as shown by FIG. 17B, since multi-tier stepwise capacitor structure is disposed at the boarder of the substrate 1750 and served as an adhesive obstruction 1770 (i.e., the multi-tier stepwise conductive layer, as shown by FIGS. 5A and 5B), therefore, the melt flow 1760 gets controlled. In other words, in the embodiments of the present invention, the multi-tier stepwise capacitor structure plays a role as an adhesive obstruction at boarders, which is able to control the melt flow produced during a press bounding process. Therefore, the thickness uniform between the upper conductive layer and the lower conductive layer located at the circuit area gets improved and moreover the distance between the upper conductive layer and the lower conductive layer can be made smaller.

Figure 18B:
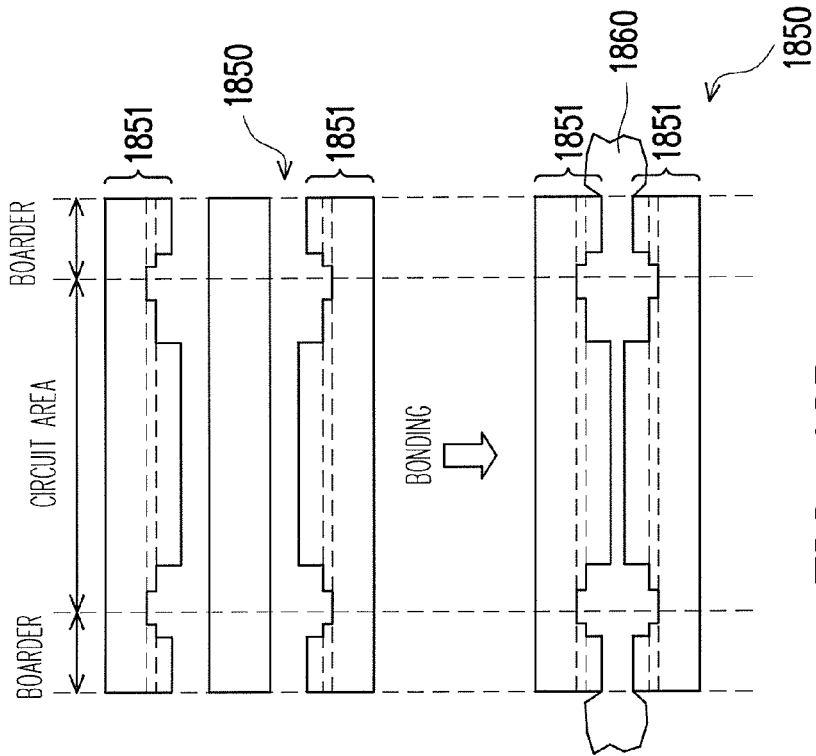
FIG. 18B is a diagram showing the melt flow during fabricating a multi-layer multi-tier stepwise capacitor according to the process of an embodiment of the present invention.
Figure 18A:
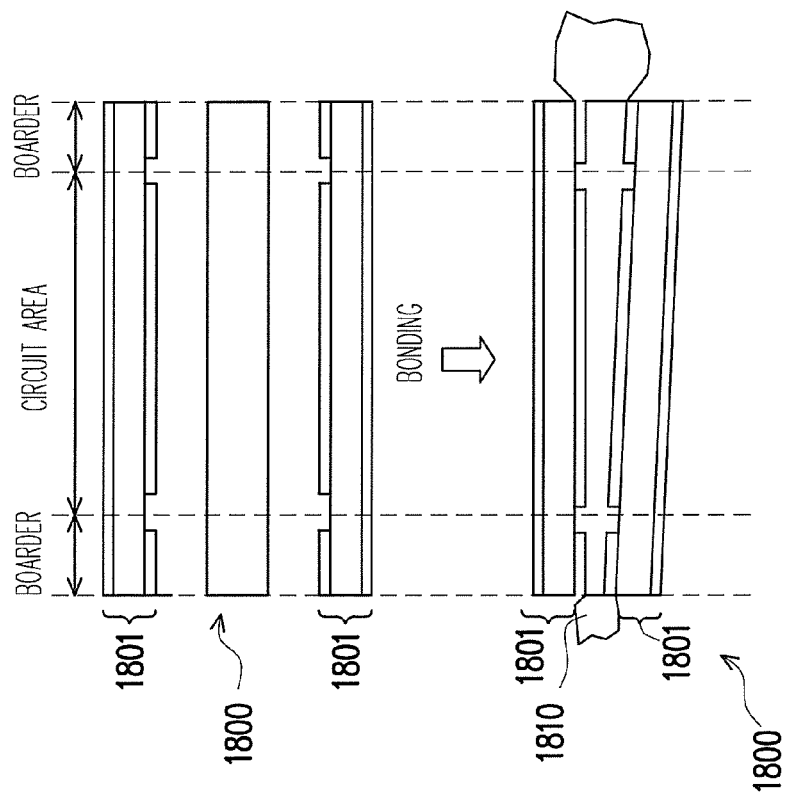
FIG. 18A is a diagram showing the melt flow during fabricating a multi-tier stepwise capacitor according to the conventional process.

FIG. 18A is a diagram showing the melt flow during fabrication of a multi-tier stepwise capacitor according to the conventional process and FIG. 18B is a diagram showing the melt flow during fabrication of a multi-tier stepwise capacitor according to the embodiments of the present invention, wherein the substrates 1801 and 1851 are in good thickness uniform.

As shown by FIG. 18A, in the prior art, the thickness of adhesive obstruction must be equal to the thickness of the conductive layer at the circuit area, so the conventional structure does not function to obstruct the melt flow. Therefore, it is not easy to control the melt flow 1810, which results in a poor thickness uniform in the conventional capacitor structure 1800. When a conventional capacitor is made on a thin substrate, the poor thickness uniform problem would be more serious.

As shown by FIG. 18B, in the process provided by the above-described embodiments of the present invention, the thickness of an adhesive obstruction is not necessarily to be same as the thickness of the circuit area. Moreover, the capacitor structures according to the above-described embodiments of the present invention may function as adhesive obstructions with different thickness, which facilitates to control the melt flow 1860 and even makes the capacitor structure 1850 has better thick uniforms. Even if a multi-tier stepwise capacitor structure according to the embodiments of the present invention is formed on a thin substrate, the thickness uniform is still good.

In the capacitor structure according to the above embodiments of the present invention, the material of a dielectric layer is unrestricted. For example, a dielectric layer can be made of ceramic and the capacitor structure according to the above embodiments of the present invention is termed as 'ceramic capacitor'.

In a metal-insulator-metal (MIM) capacitor structure, parallel connection of different capacitances may be achieved by the multi-tier stepwise capacitor structure having multi-tier stepwise conductive layers according to the above embodiments of the present invention.

In addition, large inductance, medium inductance and small inductance can be implemented by multi-tier stepwise conductive layers having different step thicknesses, and this is further beneficial to reach a hierarchical capacitor structure where large inductance paths are corresponding to low-frequency current paths, medium inductance paths are corresponding to medium-frequency current paths and small inductance paths are corresponding to high-frequency current paths. In contrast, the prior art requires a plurality of conductive vias in parallel connection to achieve large inductances, medium inductances and small inductances, which fails to reach hierarchical capacitor structures where different frequency currents flow through appropriate inductances.

It will be apparent to those ordinarily skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stepwise capacitor comprising:
   an upper conductive layer, a middle dielectric layer, and a lower conductive layer, wherein at least one of the upper conductive layer and the lower conductive layer has a stepwise structure;
   an outer dielectric layer opposed to the middle dielectric layer and disposed on one of the upper conductive layer and the lower conductive layer;
   at least one conductive via connecting to one of the upper conductive layer and the lower conductive layer and passing through the middle dielectric layer and the outer dielectric layer.

2. The stepwise capacitor according to claim 1, wherein said lower conductive layer having said stepwise structure.

3. The stepwise capacitor according to claim 2 comprising:
   a first step having a first upper surface; and a second step having a second upper surface; wherein the second upper surface being higher than the first upper surface.

4. The stepwise capacitor according to claim 3, wherein the second step is disposed on the first step.

5. The stepwise capacitor according to claim 4, wherein more than one of the second step being disposed next to each other at a distance on the first step.

6. The stepwise capacitor according to claim 4 further comprising:
   a third step having a third upper surface, being disposed on the first upper surface and adjacent to the second step; wherein the third upper surface is higher than the second upper surface.

7. The stepwise capacitor according to claim 6, wherein the third step is disposed next to the second step.

8. The stepwise capacitor according to claim 4 further comprising:
   a third step disposed on the upper surface of the second step.

9. The stepwise capacitor according to claim 3, wherein the upper conductive layer having a cross section in a shape of inverse stepwise structure.

10. The stepwise capacitor according to claim 9, wherein the inverse stepwise structure comprising:
    a first inverse step having a first lower surface; and
    a second inverse step having a second lower surface; wherein the second lower surface being lower than the first lower surface.

11. The stepwise capacitor according to claim 10, wherein the second lower surface is aligned to the second upper surface.

12. The stepwise capacitor according to claim 10, wherein the second lower surface is misaligned with regard to the second upper surface.

13. The stepwise capacitor according to claim 10, wherein the height of the second lower surface is lower than the height of the second upper surface.

14. The stepwise capacitor according to claim 10 wherein the inverse stepwise structure further comprising:
    a third inverse step having a third lower surface, the third inverse step is disposed on the lower surface of the first step and adjacent to the second inverse step; wherein the third lower surface is lower than the second lower surface.

15. The stepwise capacitor according to claim 14, wherein the third inverse step is disposed under the second lower surface of the second inverse step.

16. The stepwise capacitor according to claim 14, wherein the third inverse step is disposed next to the second inverse step.

17. The stepwise capacitor according to claim 14, wherein the second inverse step and the third inverse step are disposed with thickness complementary to each other respectively.

18. The stepwise capacitor according to claim 1, wherein the middle dielectric layer comprises:
    a first dielectric layer having a first dielectric constant; and
    a second dielectric layer having a second dielectric constant.

19. A substrate comprising a stepwise capacitor according to claim 1.

20. The substrate according to claim 19, wherein the lower conductive layer having the stepwise structure.

21. The substrate according to claim 20, wherein the stepwise capacitor comprising:
    a first step having a first upper surface; and
    a second step having a second upper surface; wherein the second upper surface being higher than the first upper surface.

22. The substrate according to claim 21, wherein the second step is disposed on the first step.

23. The substrate according to claim 22, wherein more than one of the second step being disposed next to each other at a distance on the first step.

24. The substrate according to claim 22, wherein the stepwise structure further comprising:
    a third step having a third upper surface, being disposed on the first upper surface and adjacent to the second step; wherein the third upper surface is higher than the second upper surface.

25. The substrate according to claim 24, wherein the third step is disposed next to the second step.

26. The substrate according to claim 22, wherein the stepwise structure further comprising:
    a third step disposed on the upper surface of the second step.

27. The substrate according to claim 21, wherein the upper conductive layer having a cross section in a shape of inverse stepwise structure.

28. The substrate according to claim 27, wherein the inverse stepwise structure comprising:
    a first inverse step having a first lower surface; and
    a second inverse step having a second lower surface wherein the second lower surface being lower than the first lower surface.

29. The substrate according to claim 28, wherein the second lower surface is aligned to the second upper surface.

30. The substrate according to claim 28, wherein the second lower surface is misaligned with regard to the second upper surface.

31. The substrate according to claim 28, wherein the height of the second lower surface is lower than the height of the second upper surface.

32. The substrate according to claim 28, wherein the inverse stepwise structure further comprising:
    a third inverse step having a third lower surface, the third inverse step is disposed on the lower surface of the first step and adjacent to the second inverse step; wherein the third lower surface is lower than the second lower surface.

33. The substrate according to claim 32, wherein the third inverse step disposed under the second lower surface of the second inverse step.

34. The substrate according to claim 32, wherein the third inverse step is disposed next to the second inverse step.

35. The substrate according to claim 32, wherein the second inverse step and the third inverse step are disposed with a thickness complementary to each other respectively.

36. The substrate according to claim 19, wherein the middle dielectric layer comprising:
- a first dielectric layer having a first dielectric constant; and
- a second dielectric layer having a second dielectric constant.

37. The substrate according to claim 19, wherein the upper conductive layer or the lower conductive layer is embedded in the substrate.

38. The substrate according to claim 19, wherein the upper conductive layer or the lower conductive layer is embedded in the substrate in a form of an entire layer.

39. The substrate according to claim 19, wherein the substrate is a silicon substrate, a chip carrier, a ceramic substrate, a glass substrate, a flexible substrate, or a printed circuit board.

40. The substrate according to claim 19, is made a portion of an integrated circuit package.

41. The substrate according to claim 19 is embedded in another substrate and the stepwise capacitor of the substrate is electrically coupled to a stepwise capacitor of the another substrate.

* * * * *